(12) United States Patent
Yu et al.

(10) Patent No.: US 9,305,616 B2
(45) Date of Patent: Apr. 5, 2016

(54) SEMICONDUCTOR MEMORY CELL ARRAY HAVING FAST ARRAY AREA AND SEMICONDUCTOR MEMORY INCLUDING THE SAME

(71) Applicant: Samsung Electronics Co., Ltd., Suwon-si (KR)

(72) Inventors: Haksoo Yu, Seongman-si (KR); Dae-Hyun Kim, Hwaseong-si (KR); Uksong Kang, Seongnam-si (KR); Chulwoo Park, Yongin-si (KR); Joosun Choi, Yongin-si (KR); Hyojin Choi, Suwon-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 245 days.

(21) Appl. No.: 13/943,790

(22) Filed: Jul. 17, 2013

(65) Prior Publication Data
US 2014/0025880 A1    Jan. 23, 2014

(30) Foreign Application Priority Data
Jul. 17, 2012    (KR) .......................... 10-2012-0077969

(51) Int. Cl.
| | |
|---|---|
| G06F 12/00 | (2006.01) |
| G11C 7/10 | (2006.01) |
| G06F 12/02 | (2006.01) |
| G06F 12/06 | (2006.01) |

(Continued)

(52) U.S. Cl.
CPC .......... *G11C 7/1072* (2013.01); *G06F 12/0207* (2013.01); *G06F 12/0223* (2013.01); *G06F 12/0638* (2013.01); *G11C 11/403* (2013.01); *G11C 11/40622* (2013.01); *G11C 29/783* (2013.01); *G11C 2029/4402* (2013.01)

(58) Field of Classification Search
CPC ............ G06F 12/0207; G06F 12/0223; G06F 12/0638
See application file for complete search history.

(56) References Cited

U.S. PATENT DOCUMENTS

| | | |
|---|---|---|
| 5,226,009 A | 7/1993 | Arimoto |
| 5,680,363 A | 10/1997 | Dosaka et al. |

(Continued)

FOREIGN PATENT DOCUMENTS

| | | |
|---|---|---|
| EP | 2306322 A1 | 4/2011 |
| JP | 05-108471 | 4/1993 |

(Continued)

OTHER PUBLICATIONS

Hidaka et al, "The cache DRAM architecture: a DRAM with an on-chip cache memory." Micro, IEEE, vol. 10, No. 2, pp. 14,25, Apr. 1990.

(Continued)

*Primary Examiner* — Shawn X Gu
(74) *Attorney, Agent, or Firm* — Muir Patent Law, PLLC

(57) ABSTRACT

A semiconductor memory cell array is provided which includes a first memory cell array area including first group memory cells arranged in a chip in a matrix of rows and columns and having a first operating speed; and a second memory cell array area including second group memory cells arranged in the chip in a matrix of rows and columns and having a second operating speed different from the first operating speed. The first and second memory cell array areas are accessed by addressing of a DRAM controller.

29 Claims, 22 Drawing Sheets

(51) Int. Cl.
  *G11C 11/403* (2006.01)
  *G11C 11/406* (2006.01)
  *G11C 29/00* (2006.01)
  *G11C 29/44* (2006.01)

(56) References Cited

U.S. PATENT DOCUMENTS

| | | |
|---|---|---|
| 5,875,451 A | 2/1999 | Joseph |
| 5,912,906 A | 6/1999 | Wu et al. |
| 6,055,655 A | 4/2000 | Momohara |
| 6,151,268 A * | 11/2000 | Yoshikawa ............... 365/230.09 |
| 6,170,036 B1 | 1/2001 | Konishi et al. |
| 6,175,160 B1 | 1/2001 | Paniccia et al. |
| 6,324,116 B1 | 11/2001 | Noh et al. |
| 6,347,063 B1 | 2/2002 | Dosaka et al. |
| 6,356,484 B2 | 3/2002 | Dosaka et al. |
| 6,937,503 B2 | 8/2005 | Sohn |
| 7,012,831 B2 | 3/2006 | Shigenami et al. |
| 7,023,747 B2 | 4/2006 | Takahashi |
| 7,317,256 B2 | 1/2008 | Williams et al. |
| 7,379,316 B2 | 5/2008 | Rajan |
| 7,826,266 B2 | 11/2010 | Ishii |
| 8,200,900 B2 | 6/2012 | Ishimura et al. |
| 2004/0164334 A1 | 8/2004 | Masleid et al. |
| 2004/0225830 A1 | 11/2004 | DeLano |
| 2005/0033922 A1 | 2/2005 | Jeddeloh |
| 2006/0005053 A1 | 1/2006 | Jones et al. |
| 2006/0050583 A1 | 3/2006 | Tanaka et al. |
| 2006/0104141 A1 * | 5/2006 | Jo ................................. 365/222 |
| 2008/0137451 A1 * | 6/2008 | Hayashi et al. ............... 365/190 |
| 2008/0177943 A1 | 7/2008 | Keeth et al. |
| 2009/0024819 A1 | 1/2009 | Fisher et al. |
| 2011/0296085 A1 | 12/2011 | Eleftheriou et al. |
| 2012/0091597 A1 | 4/2012 | Kwon et al. |
| 2012/0173809 A1 | 7/2012 | Ko |
| 2012/0191900 A1 | 7/2012 | Kunimatsu et al. |

FOREIGN PATENT DOCUMENTS

| | | |
|---|---|---|
| JP | 2010-250511 | 11/2010 |
| KR | 10-2001-0002116 A | 1/2001 |
| KR | 10-2004-0074745 A | 8/2004 |

OTHER PUBLICATIONS

Lee et al, "Hybrid cache architecture replacing SRAM cache with future memory technology." Circuits and Systems (ISCAS), 2012, IEEE International Symposium on, pp. 2481,2484, May 20-23, 2012.

* cited by examiner

SEMICONDUCTOR MEMORY CELL ARRAY HAVING FAST ARRAY AREA AND SEMICONDUCTOR MEMORY INCLUDING THE SAME

CROSS-REFERENCE TO RELATED APPLICATIONS

A claim for priority under 35 U.S.C. §119 is made to Korean Patent Application No. 10-2012-0077969 filed Jul. 17, 2012, in the Korean Intellectual Property Office, the entire contents of which are hereby incorporated by reference.

BACKGROUND

The present disclosure relates to a semiconductor memory, and more particularly, to configuration of a memory cell array of a semiconductor memory.

The critical dimension (CD) of a volatile semiconductor memory such as a dynamic random access memory (DRAM) may be gradually scaled down according to a demand on high speed, large capacity, and low power.

Although it is difficult to continue to scale down the critical dimension due to a limit to the resolution of photolithography, improvement on the performance of a memory chip may be continuously desired. Also, a large storage capacity and a low-power characteristic may be desired.

SUMMARY

One embodiment is directed to provide a semiconductor memory cell array which comprises a first memory cell array area including first group memory cells arranged in a chip in a matrix of rows and columns and having a first operating speed; and a second memory cell array area including second group memory cells arranged in the chip in a matrix of rows and columns and having a second operating speed different from the first operating speed, wherein the first and second memory cell array areas are accessed by addressing of a DRAM controller.

Another embodiment is directed to provide a semiconductor memory cell array which comprises a first memory cell array area including first group memory cells arranged in a chip in a matrix of rows and columns and having a first operating speed; and a second memory cell array area including second group memory cells arranged in the chip in a matrix of rows and columns and having a second operating speed faster than the first operating speed, an input-output sense amplifier being interposed between the first memory cell array area and the second memory cell array area.

Still another embodiment is directed to provide a dynamic random access memory which comprises a semiconductor memory cell array including a first memory cell array area including first group memory cells arranged in a chip in a matrix of rows and columns and having a first operating speed and a second memory cell array area including second group memory cells arranged in the chip in a matrix of rows and columns and having a second operating speed different from the first operating speed; a decoding unit configured to select rows and columns of the semiconductor memory cell array; and a buffer unit configured to buffer a command, an address, write data, and output data read from the semiconductor memory cell array.

In still another embodiment, a random access method comprises forming a first memory cell array area including first group memory cells having a first operating speed and a second memory cell array area having a second operating speed faster than the first operating speed; and accessing the first memory cell array area using a low address of a basic address and the second memory cell array area using a high address of the basic address.

In still another embodiment, a random access method comprises forming a first memory cell array area including first group memory cells having a first operating speed and a second memory cell array area having a second operating speed faster than the first operating speed; and accessing the first memory cell array area using a basic address and the second memory cell array area using an extended address extended from the basis address.

Still another embodiment is directed to provide a semiconductor memory cell array which comprises a first memory cell array area including first group memory cells arranged in a chip in a matrix of rows and columns and having a first operating speed; and a second memory cell array area including second group memory cells arranged in the chip in a matrix of rows and columns and having a second operating speed faster than the first operating speed, wherein the first memory cell array area and the second memory cell array area are accessed by addressing of a DRAM controller and have different bit line loading from each other.

In example embodiments, the first memory cell array area and the second memory cell array area share a word line enable signal of a row decoder to have the same bit line loading.

In example embodiments, the first memory cell array area and the second memory cell array area are connected to separated word lines and have different word line loading.

In example embodiments, the second memory cell array area is connected with a column repair circuit and is used as a fail address memory to a column fail address for a column repair.

In example embodiments, the second memory cell array area is connected with a refresh control circuit and is used as a refresh information memory to store refresh strong/weak data for a refresh skip operation.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
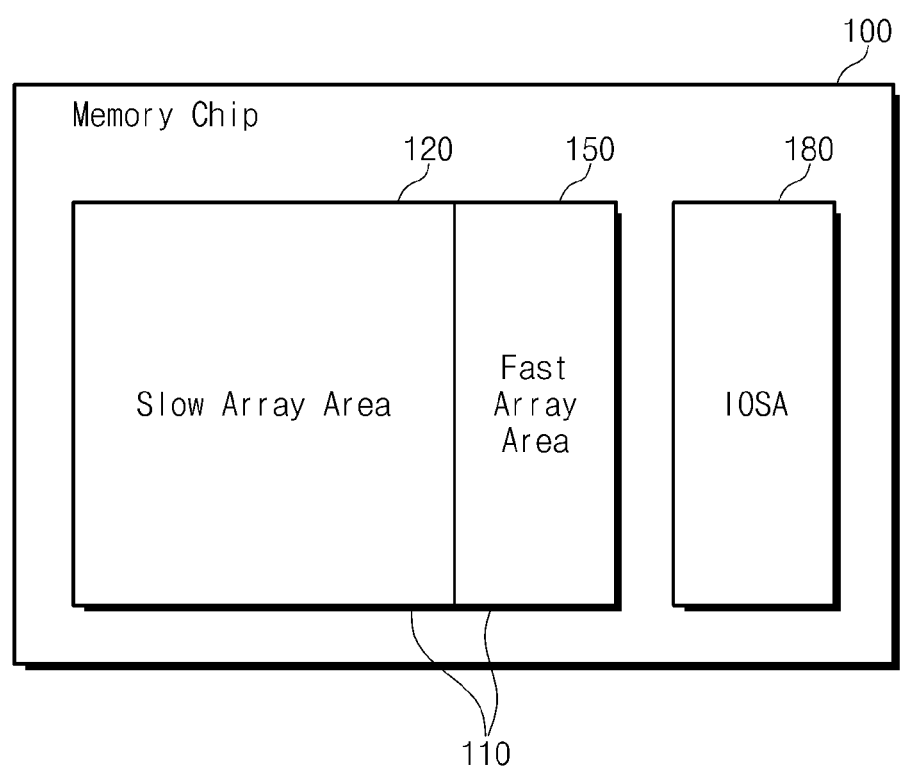
FIG. 1 is a block diagram illustrating arrangement of a semiconductor memory cell array according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples. Accordingly, known processes, elements, and techniques are not described with respect to some of the embodiments. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings described herein.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments disclosed herein may include their complementary embodiments. Note that a data access operation associated with a DRAM and details of an internal function circuit are skipped to prevent the disclosure from becoming ambiguous.

FIG. 1 is a block diagram illustrating arrangement of a semiconductor memory cell array according to an exemplary embodiment.

Referring to FIG. 1, a semiconductor memory 100 may include a slow array area 120 as a first memory cell array area, a fast array area 150 as a second memory cell array area, and an input-output sense amplifier 180.

The slow array area 120 and the fast array area 150 may be included in the same chip, and may form a semiconductor memory cell array 110 of the semiconductor memory 100.

The slow array area 120 may include a first group of memory cells which have a first operating speed and are arranged in a matrix of rows and columns in the same chip.

The fast array area 150 may include a second group of memory cells which have a second operating speed different from the first operating speed and are arranged in a matrix of rows and columns in the same chip.

Compared with the slow array area 120, the fast array area 150 may be disposed to be closer to the input-output sense amplifier 180 in view of a speed characteristic.

In one embodiment, a data storage capacity of the slow array area 120 may be larger than that of the fast array area 150.

A data access speed of the fast array area 150 may be faster than that of the slow array area 120.

Figure 2:
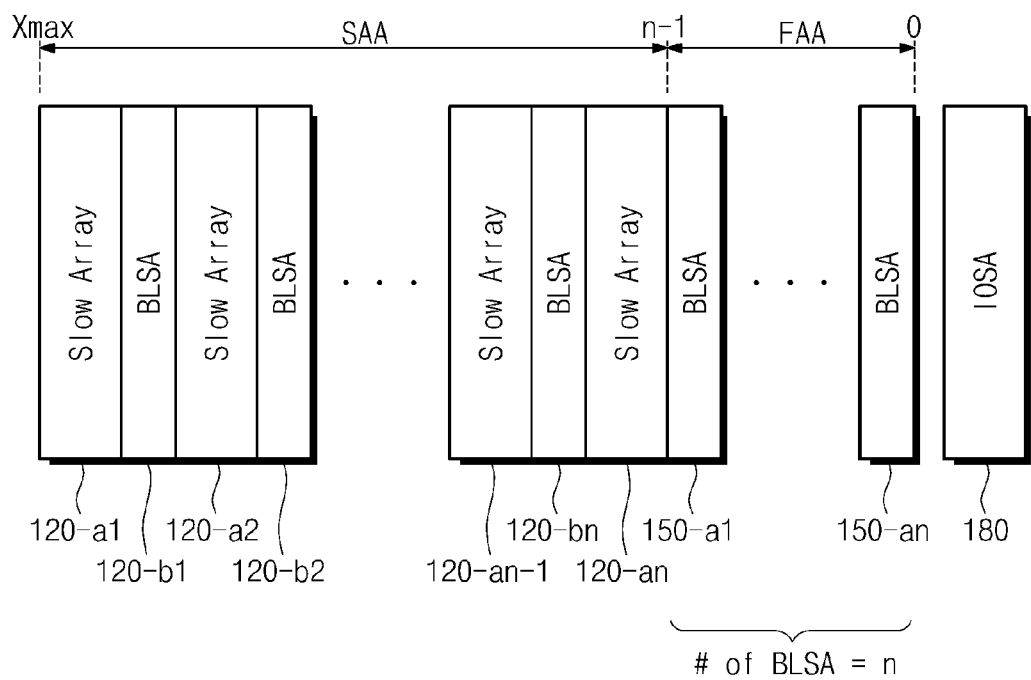
FIG. 2 is a diagram illustrating a semiconductor memory cell array according to one exemplary embodiment.

FIG. 2 is a diagram illustrating a semiconductor memory cell array according to an exemplary embodiment.

Referring to FIG. 2, a slow array area 120 may include a plurality of slow arrays 120-*a*1 to 120-*a*n and a plurality of bit line sense amplifiers 120-*b*1 to 120-*b*n. As shown for example in FIG. 2, the plurality of slow arrays 120-*a*1 to 120-*a*n may be alternately arranged between the plurality of bit line sense amplifiers 120-*b*1 to 120-*b*2. Also, a fast array area 150 may include a plurality of fast arrays 150-*a*1 to 150-*a*n and a plurality of bit line sense amplifiers disposed among the plurality of fast arrays 150-*a*1 to 150-*a*n.

As shown in FIG. 2, in one embodiment, the plurality of fast arrays 150-*a*1 to 150-*a*n may be formed of bit line sense amplifiers of a DRAM. In one embodiment, a bit line sense amplifier may be used to store 1-bit data. The number of bit line sense amplifiers may be n (n being an integer of 2 or more). The number of bit line sense amplifiers may be based on a design capacity of the fast array area 150.

A data access speed of a fast array formed of a plurality of bit line sense amplifiers may be faster than that of the slow array including DRAM cells each formed of an access transistor and a storage capacitor. A read operation or a write operation of the fast array belonging to the data access speed may be fast.

In FIG. 2, a letter symbol "SAA" may indicate a slow access address and a letter symbol "FAA" may indicate a fast access address. Herein, "SAA" and "FAA" may correspond to one of a row address and a column address.

In FIG. 2, the fast array area 150 being a second memory cell array area may be accessed using a low address 0 to (n−1) of a basic address 0 to Xmax. The slow array area 120 being a first memory cell array area may be accessed using a high address (n−1) to Xmax of the basic address 0 to Xmax.

In other example embodiments, the fast array area 150 may be accessed using a high address (n−1) to Xmax. The slow array area 120 may be accessed using a low address 0 to (n−1).

In FIG. 2, a memory density of a chip may be maintained and second group of memory cells (memory cells formed of bit line sense amplifiers) of the fast array area 150 may be formed of memory cells different from first group of memory cells (memory cells formed of DRAM cells). As a result, the first and second memory cell array areas 120 and 150 may be formed of hetero memory cells.

Figure 3:
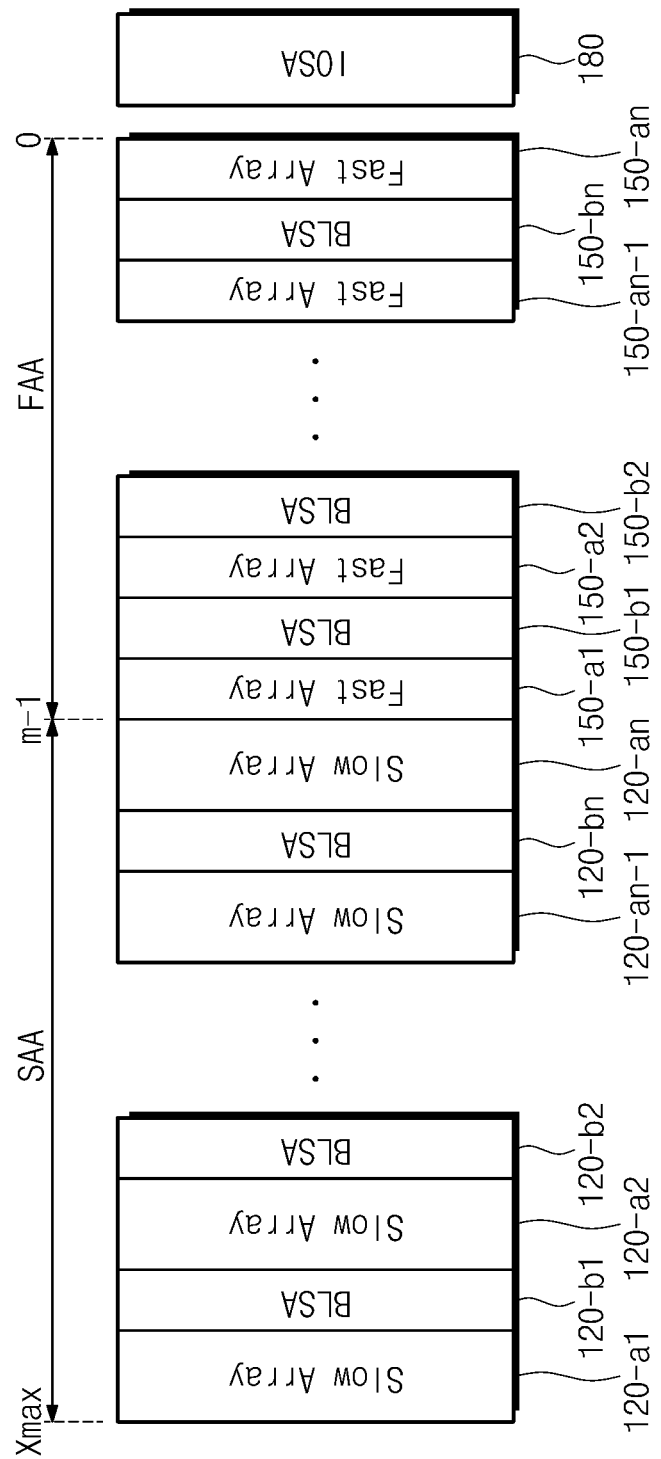
FIG. 3 is a diagram illustrating a semiconductor memory cell array according to another exemplary embodiment.

An exemplary embodiment in which the first and second memory cell array areas 120 and 150 are formed of homo memory cells is illustrated in FIG. 3.

FIG. 3 is a diagram illustrating a semiconductor memory cell array according to another exemplary embodiment.

Referring to FIG. 3, a slow array area 120 may include a plurality of slow arrays 120-*a*1 to 120-*a*n and a plurality of bit line sense amplifiers 120-*b*1 to 120-*b*n. Also, a fast array area 150 may include a plurality of fast arrays 150-*a*1 to 150-*a*n and a plurality of bit line sense amplifiers 150-*b*1 to 150-*b*n.

In FIG. 3, the plurality of fast arrays 150-*a*1 to 150-*a*n may be formed of DRAM memory cells. A data access speed of DRAM memory cells in the fast arrays 150-*a*1 to 150-*a*n may be faster than that of DRAM memory cells in the slow arrays 120-*a*1 to 120-*a*n. For example, in the case that a first group of memory cells are DRAM cells each having normal word line (or, bit line) loading, a second group of memory cells may be formed of DRAM cells each having loading smaller than the normal word line (or, bit line) loading.

For example, in the case that the number of memory cells connected to a bit line of the fast array 150-*a*1 is less than the number of memory cells connected to a bit line of the slow array 120-*a*1, a memory cell in the fast array 150-*a*1 may have relatively small line loading. Thus, a memory cell in the fast array 150-*a*1 may operate at a relatively high speed. As a result, although memory cells are homo memory cells, the performance of a memory chip may be improved when memory cells each having small line loading are disposed at the fast array area 150.

Also, it is possible to obtain a low-power consumption characteristic through the slow array area 120.

In FIG. 3, a letter symbol "SAA" may indicate a slow access address and a letter symbol "FAA" may indicate a fast access address. Herein, "SAA" and "FAA" may correspond to one of a row address and a column address.

In FIG. 3, the fast array area 150 being a second memory cell array area may be accessed using a low address 0 to (m−1) of a basic address 0 to Xmax. The slow array area 120 being a first memory cell array area may be accessed using a high address (n−1) to Xmax of the basic address 0 to Xmax.

In other example embodiments, the fast array area 150 may be accessed using a high address (m−1) to Xmax. The slow array area 120 may be accessed using a low address 0 to (m−1).

In FIG. 3, a memory density of a chip may be maintained and a second group of memory cells (DRAM memory cells having small line loading) of the fast array area 150 may be formed of the same type of memory cells as a first group of memory cells (DRAM memory cells having relatively large line loading). As a result, the first and second memory cell array areas 120 and 150 may be formed of homo memory cells. In the case that a memory cell array is formed of homo memory cells although line loading is different, a fabricating process may be relatively easy.

Figure 4:
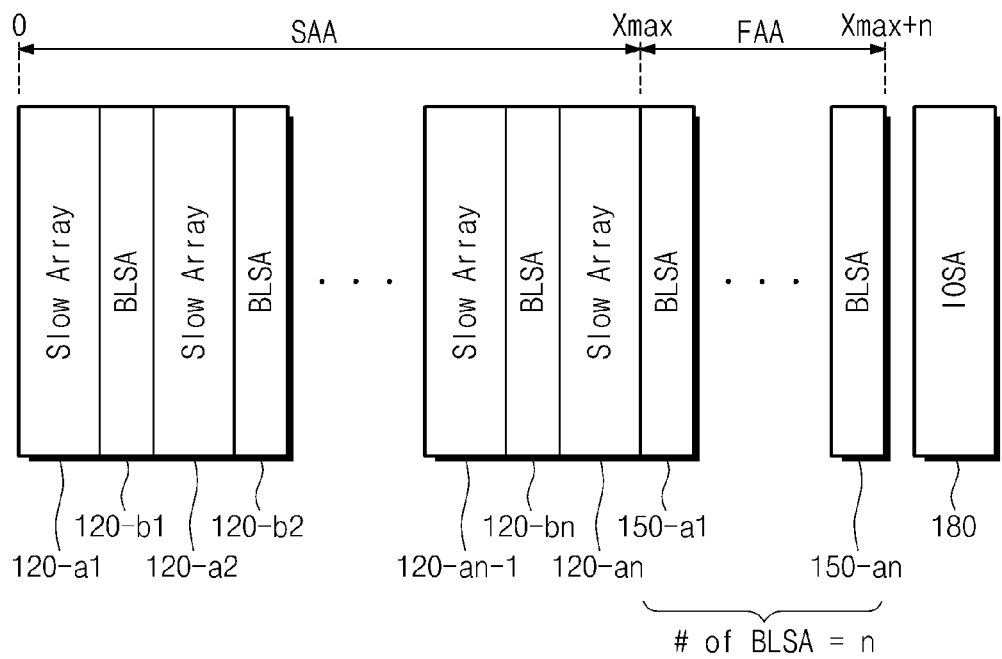
FIG. 4 is a diagram illustrating a semiconductor memory cell array according to still another exemplary embodiment.

An embodiment in which a memory density increases is illustrated in FIG. 4.

FIG. 4 is a diagram illustrating a semiconductor memory cell array according to still another exemplary embodiment.

Referring to FIG. 4, a slow array area 120 may include a plurality of slow arrays 120-*a*1 to 120-*a*n and a plurality of bit line sense amplifiers 120-*b*1 to 120-*b*n. Also, a fast array area 150 may include a plurality of fast arrays 150-*a*1 to 150-*a*n and a plurality of bit line sense amplifiers disposed among the plurality of fast arrays 150-*a*1 to 150-*a*n.

In FIG. 4, the plurality of fast arrays 150-*a*1 to 150-*a*n may be formed of bit line sense amplifiers of a DRAM. For example, like in FIG. 2, a bit line sense amplifier may be used to store 1-bit data. The number of bit line sense amplifiers may be n (n being an integer of 2 or more). The number of bit line sense amplifiers may be based on a design capacity of the fast array area 150.

In FIG. 4, the slow array area 120 being a first memory cell array area may be accessed using a basic address 0 to Xmax. The fast array area 150 being a second memory cell array area may be accessed using an extended address Xmax to Xmax+n extended from the basic address 0 to Xmax.

In other example embodiments, the fast array area 150 may be accessed using the basic address 0 to Xmax. The slow array area 120 may be accessed using the extended address Xmax to Xmax+n.

In FIG. 4, a memory density of a chip may be maintained and the second group of memory cells (memory cells formed of bit line sense amplifiers) of the fast array area 150 may be formed of memory cells different from the first group of memory cells (memory cells formed of DRAM cells). As a result, the first and second memory cell array areas 120 and 150 may be formed of hetero memory cells.

Figure 5:
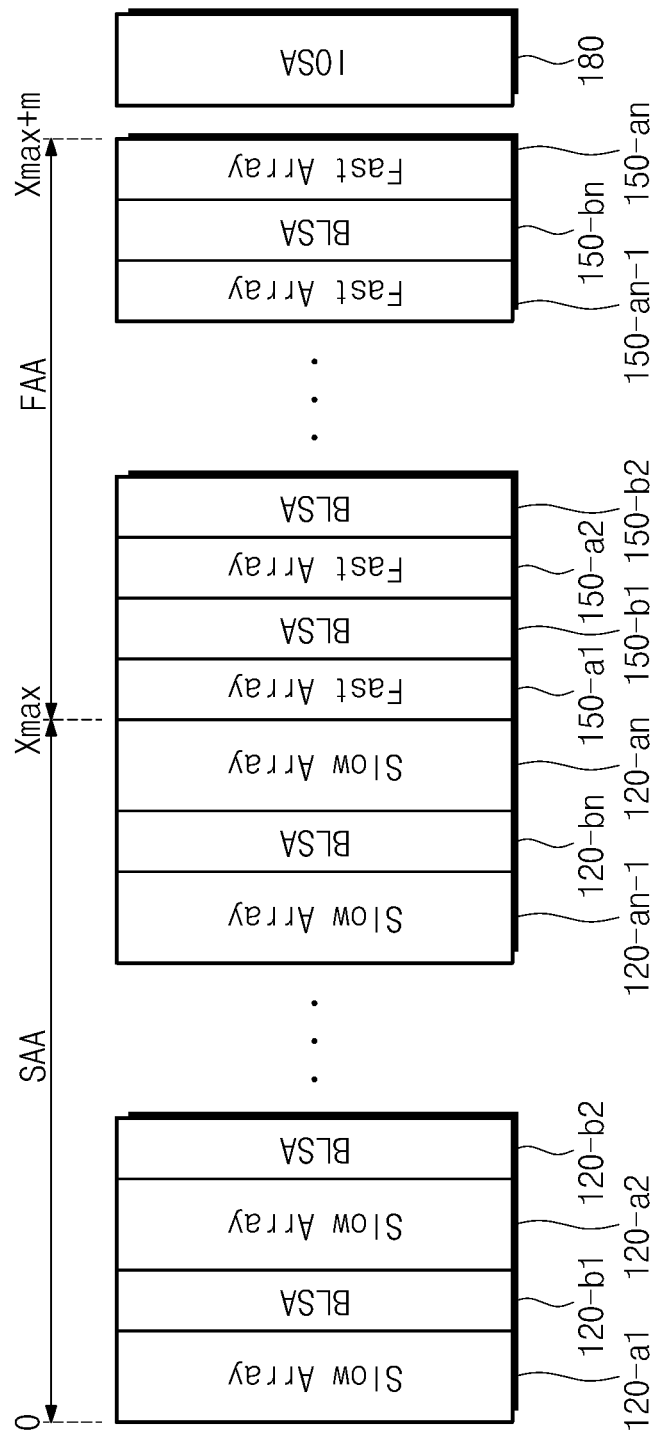
FIG. 5 is a diagram illustrating a semiconductor memory cell array according to still another exemplary embodiment.

An embodiment in which a memory density of a chip increases while the first and second memory cell array areas 120 and 150 are formed of homo memory cells is illustrated in FIG. 5.

FIG. 5 is a diagram illustrating a semiconductor memory cell array according to still another exemplary embodiment.

Referring to FIG. 5, a slow array area 120 may include a plurality of slow arrays 120-*a*1 to 120-*a*n and a plurality of bit line sense amplifiers 120-*b*1 to 120-*b*n. Also, a fast array area 150 may include a plurality of fast arrays 150-*a*1 to 150-*a*n and a plurality of bit line sense amplifiers 150-*b*1 to 150-*b*n.

In FIG. 5, the plurality of fast arrays 150-*a*1 to 150-*a*n may be formed of DRAM memory cells. A data access speed on DRAM memory cells in the fast arrays 150-*a*1 to 150-*a*n may be faster than that on DRAM memory cells in the slow arrays 120-*a*1 to 120-*a*n. As such, like FIG. 3, in the case that a first group of memory cells are DRAM cells each having normal word line (or, bit line) loading, a second group of memory cells may be formed of DRAM cells each having loading smaller than the normal word line (or, bit line) loading.

Thus, line loading of a memory cell in the fast array 150-*a*1 is relatively small, thus operating in relatively high speed. As a result, although memory cells are homo memory cells, the performance of a memory chip may be improved when memory cells each having small line loading are disposed at the fast array area 150. It is possible to obtain a low-power consumption characteristic through the slow array area 120.

In FIG. 5, in one embodiment, the slow array area 120 being a first memory cell array area may be accessed using a basic address 0 to Xmax. The fast array area 150 being a second memory cell array area may be accessed using an extended address Xmax to Xmax+n extended from the basic address 0 to Xmax. In other example embodiments, the fast array area 150 may be accessed using the basis address 0 to Xmax. The slow array area 120 may be accessed using the extended address Xmax to Xmax+n.

In FIG. 5, a memory density of a chip may be maintained and the second group of memory cells (DRAM memory cells having small line loading) of the fast array area 150 may be formed of the same type of memory cells as the first group of memory cells (DRAM memory cells having relatively large line loading). As a result, the first and second memory cell array areas 120 and 150 may be formed of homo memory cells. In this case, a fabricating process may be relatively easy.

Figure 6:
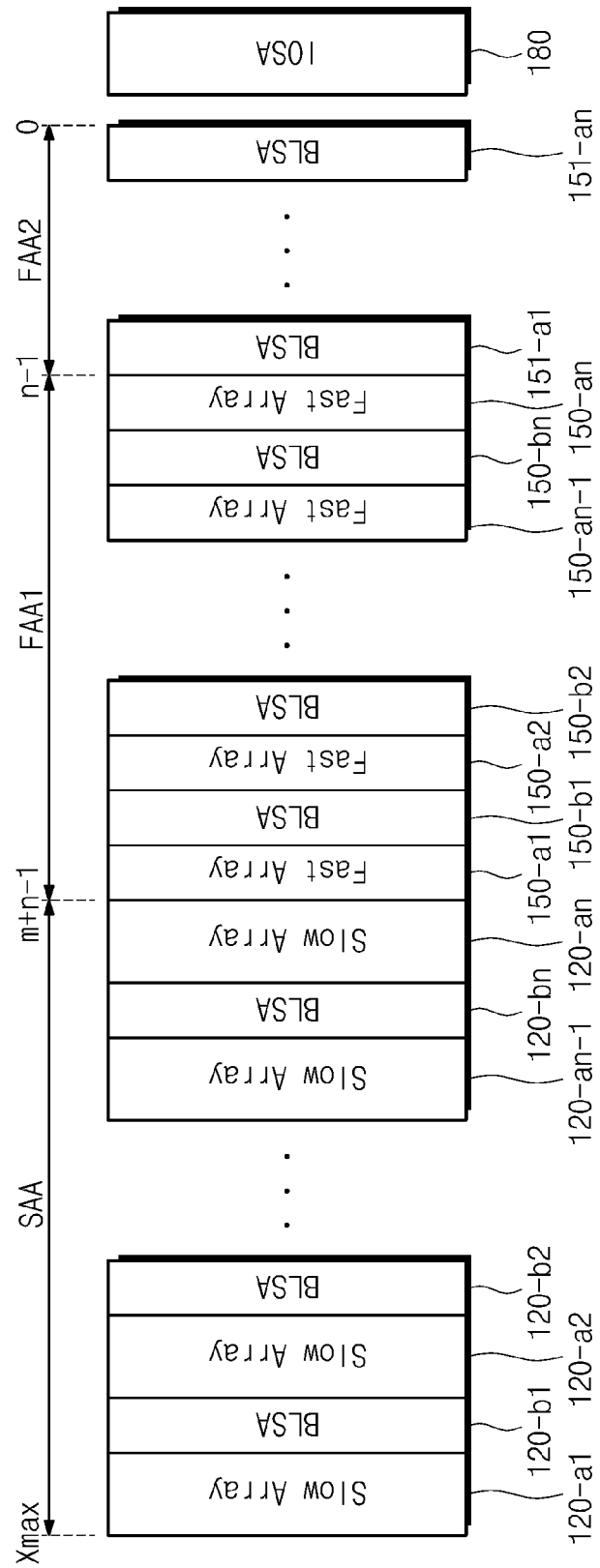
FIG. 6 is a diagram illustrating a semiconductor memory cell array according to still another exemplary embodiment.

FIG. 6 is a diagram illustrating a semiconductor memory cell array according to still another exemplary embodiment.

Referring to FIG. 6, in one embodiment, while a slow array area 120 is the same as that in FIG. 3, a fast array area 150 may be formed of two types of fast array areas. A first fast array area 150 may include a plurality of fast arrays 150-*a*1 to 150-*a*n and a plurality of bit line sense amplifiers 150-*b*1 to 150-*b*n. A second fast array area 151 may include a plurality of fast arrays 151-*a*1 to 151-*a*n and a plurality of bit line sense amplifiers disposed among the plurality of fast arrays 151-*a*1 to 151-*a*n. As shown in FIG. 6, in one embodiment, the plurality of fast arrays 150-*a*1 to 150-*a*n may be formed of bit line sense amplifiers.

The first fast array area 150 accessed by FAA1 may be formed of the same homo cells as that of the slow array area 120, and the second fast array area 151 accessed by FAA2 may be formed of hetero cells different from that of the slow array area 120. As described above, line loading of homo cells may be different from one another. In one embodiment, the cells that form the first array area comprise a first group of cells, the cells that form the second array area comprise a second group of cells, and the cells that form the third array area comprise a third group of cells.

In FIG. 6, the second fast array area 151 may be accessed using a lower row address 0 to (n−1) of a basic address 0 to Xmax. The first fast array area 150 may be accessed using an upper row address (n−1) to (m+n−1) of the basic address 0 to Xmax. The slow array area 120 being a first memory cell array area may be accessed using a high address (m+n−1) to Xmax of the basic address 0 to Xmax.

An access of each area may be set to be opposite to the above-described case.

In FIG. 6, a memory density of a chip may be maintained and the second memory cell array area may be divided into two types. If the fast array area is formed in a hybrid type in which hetero cells and homo cells exist, a range of application of the fast array area may be expanded.

Figure 7:
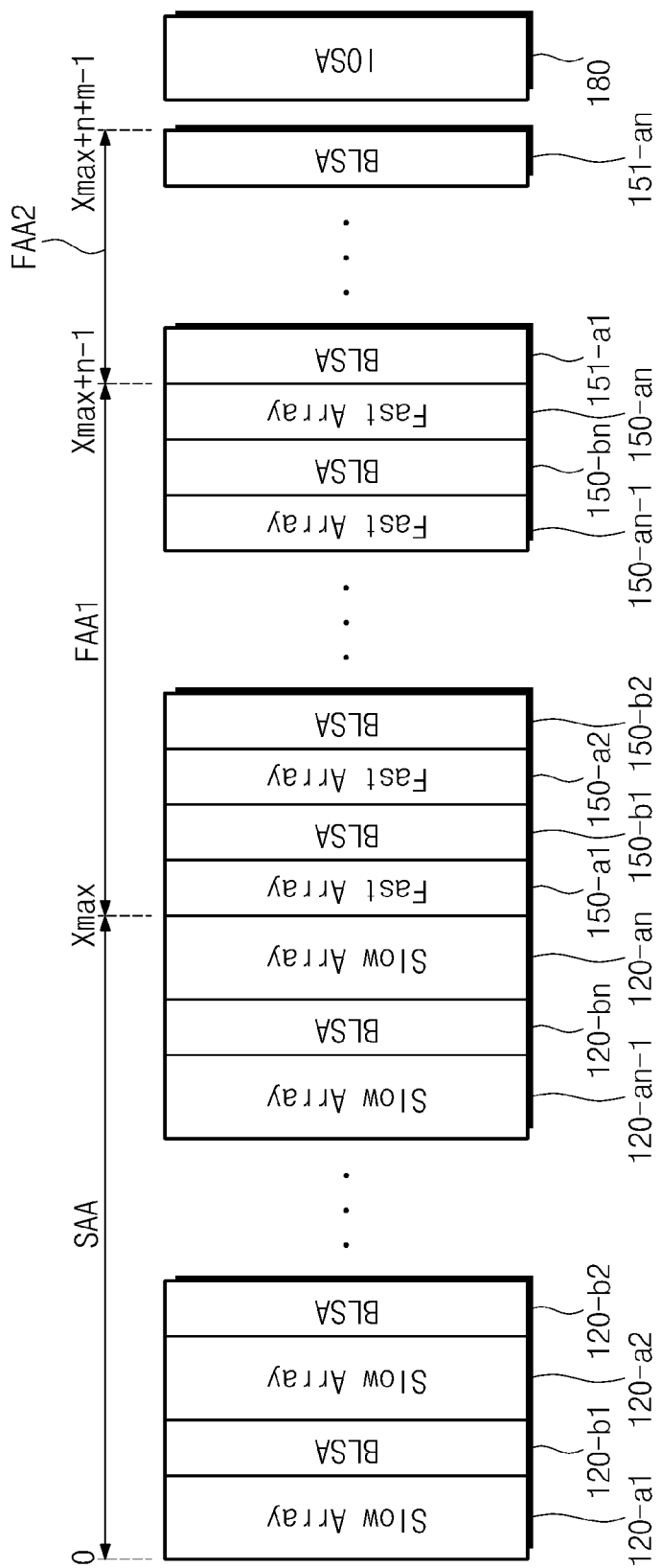
FIG. 7 is a diagram illustrating a semiconductor memory cell array according to still another exemplary embodiment.

An exemplary embodiment in which a memory density of a chip increases and a fast array area is formed of hybrid-type cells like FIG. 6 is illustrated in FIG. 7.

FIG. 7 is a diagram illustrating a semiconductor memory cell array according to still another exemplary embodiment.

A memory cell array in FIG. 7 may be configured the same as that in FIG. 6 except for assignment of addresses.

A first fast array area 150 accessed by FAA1 may be formed of homo cells like a slow array area 120, and a second fast array area 151 accessed by FAA2 may be formed of hetero cells unlike the slow array area 120. As described above, homo cells may have different loading.

In FIG. 7, the slow array area 120 may be accessed using a basic address 0 to Xmax. The first fast array area 150 may be accessed using a lower extended address Xmax to Xmax+n−1 extended from the basic address 0 to Xmax. The second fast array area 151 may be accessed using an upper extended address Xmax+n−1 to Xmax+n+m−1 extended from the basic address 0 to Xmax.

In FIGS. 2 to 7, compared with the slow array area 120, an input-output sense amplifier 180 may be disposed to be closer to the fast array area 150. Since a data input/output speed of the fast array area 150 should be faster than that of the slow array area 120, the fast array area 150 may be disposed to be relatively closer to the input-output sense amplifier 180. However, it may be useful to consider a data input/output speed of the slow array area 120 as well. This will be more fully described with reference to FIG. 8.

Figure 8:
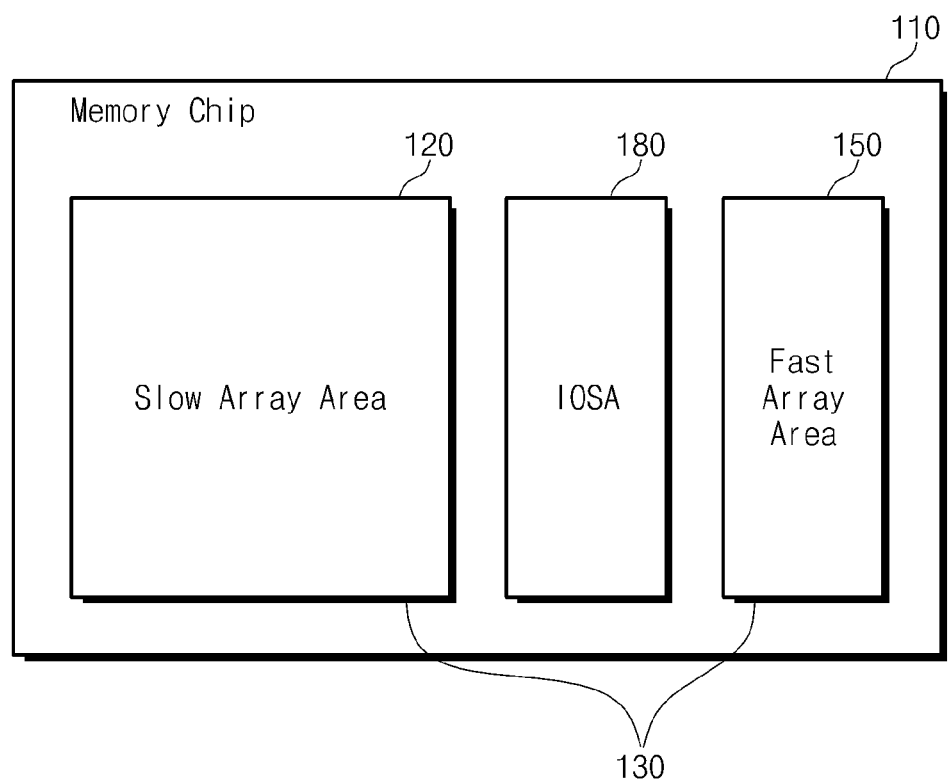
FIG. 8 is a block diagram schematically illustrating arrangement of a semiconductor memory cell array according to another exemplary embodiment.

FIG. 8 is a block diagram schematically illustrating an arrangement of a semiconductor memory cell array according to another exemplary embodiment.

Referring to FIG. 8, a semiconductor memory 110 may include a slow array area 120 as a first memory cell array area, a fast array area 150 as a second memory cell array area, and an input-output sense amplifier 180.

The fast array area 150 and the slow array area 120 may be provided in the same chip, and may form a semiconductor memory cell array 130. The input-output sense amplifier 180 may be disposed between the fast array area 150 and the slow array area 120.

The slow array area 120 may include first group memory cells arranged in a matrix of rows and columns and having a first operating speed. Herein, the first group memory cells may be formed at the same chip.

The fast array area 150 may include second group memory cells arranged in a matrix of rows and columns and having a second operating speed faster than the first operating speed. Herein, the second group memory cells may be formed at the same chip.

The input-output sense amplifier 180 may be disposed between the fast array area 150 and the slow array area 120 to prevent an operating speed of the slow array area 120 from being lowered.

Like FIG. 1, a data storage capacity of the slow array area 120 may be larger than that of the fast array area 150. Also, a data access speed of the fast array area 150 may be set to be faster than that of the slow array area 120.

Figure 9:
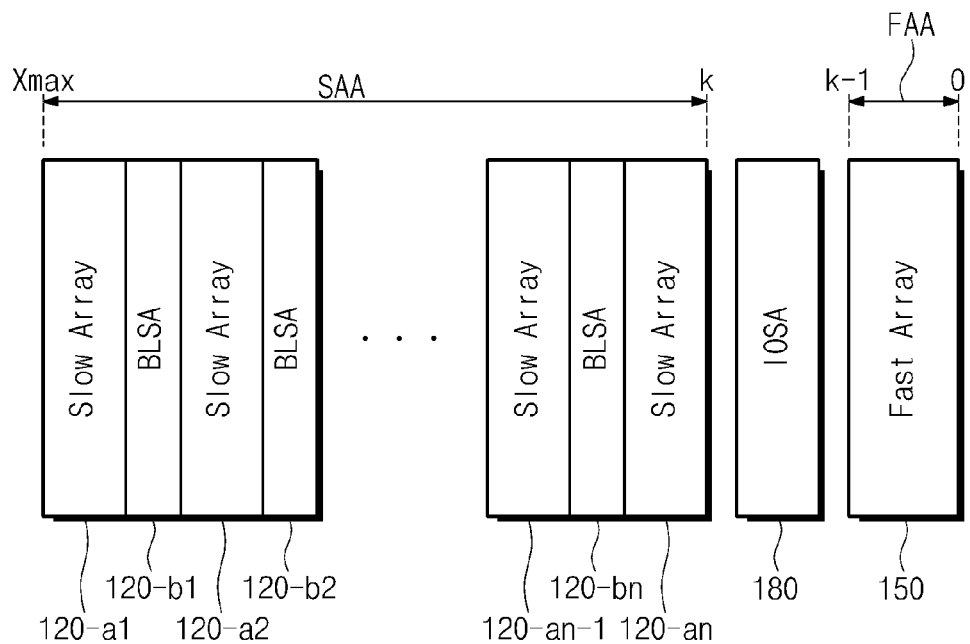
FIG. 9 is a diagram illustrating an exemplary embodiment of a semiconductor memory cell array in FIG. 8.

FIG. 9 is a diagram illustrating an exemplary embodiment of a semiconductor memory cell array in FIG. 8.

In FIG. 9, there is illustrated an example in which the fast array area 150 and the slow array area 120 are formed of hetero memory cells while maintaining a memory density of a chip.

Referring to FIG. 9, the slow array area 120 may include a plurality of slow arrays 120-a1 to 120-an and a plurality of bit line sense amplifiers 120-b1 to 120-bn. Also, the fast array area 150 may include a plurality of bit line sense amplifiers disposed between the plurality of fast arrays and the plurality of fast arrays as shown in FIG. 5.

In one embodiment, the plurality of fast arrays may be formed of SRAM cells. For example, an SRAM cell may be used as a memory cell capable of storing 1-bit data.

A data access speed of the SRAM cell formed of six CMOS transistors may be faster than that of a DRAM cell.

In FIG. 9, a letter symbol "SAA" may indicate a slow access address and a letter symbol "FAA" may indicate a fast access address. Herein, "SAA" and "FAA" may correspond to one of a row address and a column address.

In FIG. 9, the fast array area 150 being a second memory cell array area may be accessed using a low address 0 to (k−1) of a basic address 0 to Xmax. The slow array area 120 being a first memory cell array area may be accessed using a high address (k−1) to Xmax of the basic address 0 to Xmax.

In other example embodiments, the fast array area 150 may be accessed using a high address (k−1) to Xmax. The slow array area 120 may be accessed using a low address 0 to (k−1).

In FIG. 9, a memory density of a chip may be maintained and second group memory cells (e.g., SRAM cells) of the fast array area 150 may be formed of memory cells different from first group memory cells (e.g., memory cells formed of DRAM cells). As a result, the first and second memory cell array areas 120 and 150 may be formed of hetero memory cells.

Figure 10:
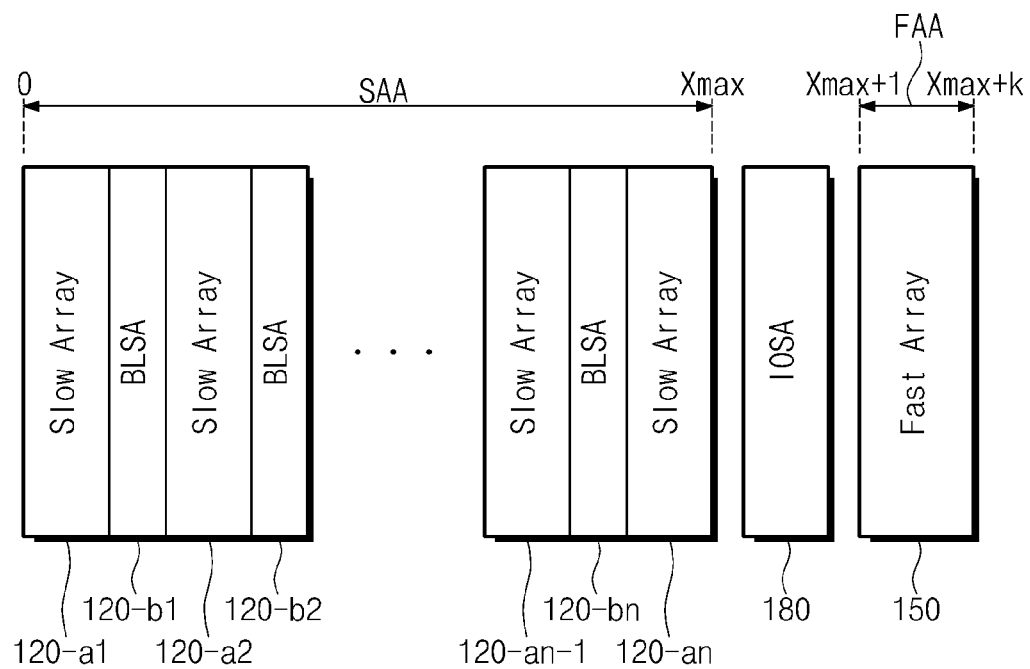
FIG. 10 is a diagram illustrating another exemplary embodiment of a semiconductor memory cell array in FIG. 8.

FIG. 10 is a diagram illustrating another exemplary embodiment of a semiconductor memory cell array in FIG. 8.

In FIG. 10, there is illustrated an example in which a fast array area 150 and a slow array area 120 are formed of hetero memory cells while maintaining a memory density of a chip.

Referring to FIG. 10, the slow array area 120 may include a plurality of slow arrays 120-a1 to 120-an and a plurality of bit line sense amplifiers 120-b1 to 120-bn. Also, the fast array area 150 may include a plurality of bit line sense amplifiers disposed between the plurality of fast arrays and the plurality of fast arrays as shown in FIG. 5.

Like FIG. 9, the plurality of fast arrays in FIG. 10 may be formed of SRAM cells. For example, an SRAM cell may be used as a memory cell capable of storing 1-bit data.

In FIG. 10, the fast array area 150 being a second memory cell array area may be accessed using an extended address Xmax+1 to Xmax+k. The slow array area 120 being a first memory cell array area may be accessed using a basic address 0 to Xmax.

In other example embodiments, the fast array area 150 may be accessed using the basic address. The slow array area 120 may be accessed using the extended address.

In FIG. 10, a memory density of a chip may be maintained and a second group of memory cells (SRAM cells) of the fast array area 150 may be formed of memory cells different from a first group of memory cells (memory cells formed of DRAM cells). As a result, the first and second memory cell array areas 120 and 150 may be formed of hetero memory cells, not homo memory cells.

Figure 11:
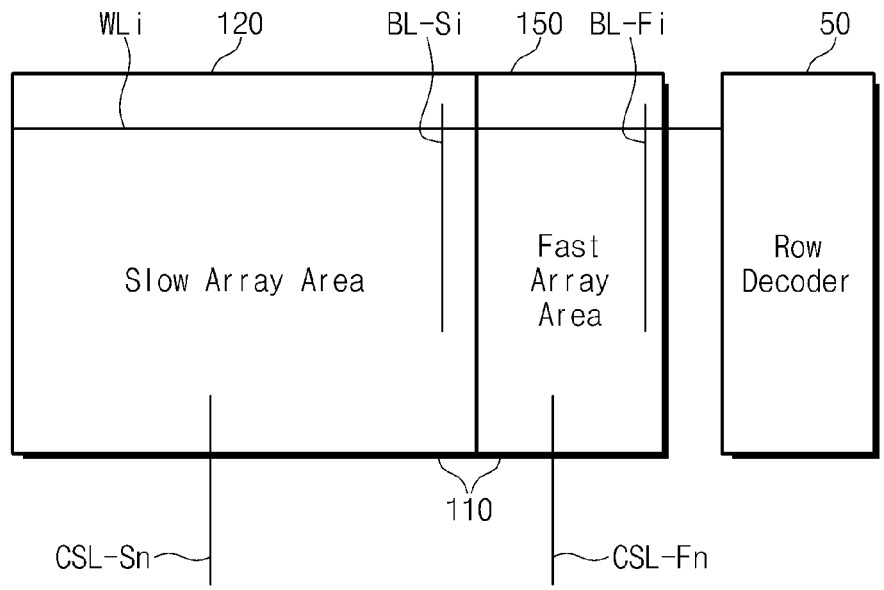
FIG. 11 is a diagram illustrating arrangement of word lines of a semiconductor memory cell array in FIG. 1 or 8 according to an exemplary embodiment.

FIG. 11 is a diagram illustrating an arrangement of word lines of a semiconductor memory cell array in FIG. 1 or 8 according to an exemplary embodiment.

Referring to FIG. 11, a semiconductor memory cell array 110 may include a slow array area 120 as a first memory cell array area and a fast array area 150 as a second memory cell array area.

A word line WLi extended from a row decoder 50 may be disposed to cross the slow array area 120 and the fast array area 150. As such, the word line WLi may be shared by the slow array area 120 and the fast array area 150. If the word line WLi is selected by the row decoder 50, memory cells of the slow array area 120 and memory cells of the fast array area 150 connected with the word line WLi may be accessed at the same time. As such, in one embodiment, both the slow array area and the fast array area share the same word lines.

In the case that memory cells of the slow array area 120 and memory cells of the fast array area 150 are formed of homo cells, the cell-per-bit line number of the fast array area 150 may be less than the cell-per-bit line number of the slow array area 120. For example, the fast array area may have fewer cells per bit line for the area than in the slow array area. This may mean that bit line loading of the fast array area 150 is smaller than that of the slow array area 120. Thus, a read/write operating speed on the fast array area 150 may be faster than that on the slow array area 120.

Compared with the slow array area 120, the fast array area 150 can be disposed to be closer to the row decoder 50 in view of a speed characteristic.

A bit line BL-Fi of the fast array area 150 may be connected to a column selection line CSL-Fn via a bit line sense amplifier (not shown), and a bit line BL-Si of the slow array area 120 may be connected to a column selection line CSL-Sn via a bit line sense amplifier. Although the column selection lines CSL-Fn and CSL-Sn may be simultaneously selected after the word line WLi is activated, write data received at a write operation may be stored at a memory cell of the fast array area 150 to be relatively faster. As such, a speed in which write data is stored at the slow array area 120 may be slower than a speed in which write data is stored at the fast array area 150. Likewise, although the column selection lines CSL-Fn and CSL-Sn are simultaneously selected after the word line WLi is activated, at a read operation, data stored at a memory cell of the fast array area 150 may be read out faster compared with data stored at a memory cell of the slow array area 120. As such, a speed in which data stored at the slow array area 120 is read out may be slower than a speed in which data stored at the fast array area 150 is read out.

In FIG. 11 where the slow array area 120 and the fast array area 150 share a word line not separated, in the case where bit line loading is different, a data access speed of the fast array area 150 may be faster than a data access speed of the slow array area 120.

Figure 12:
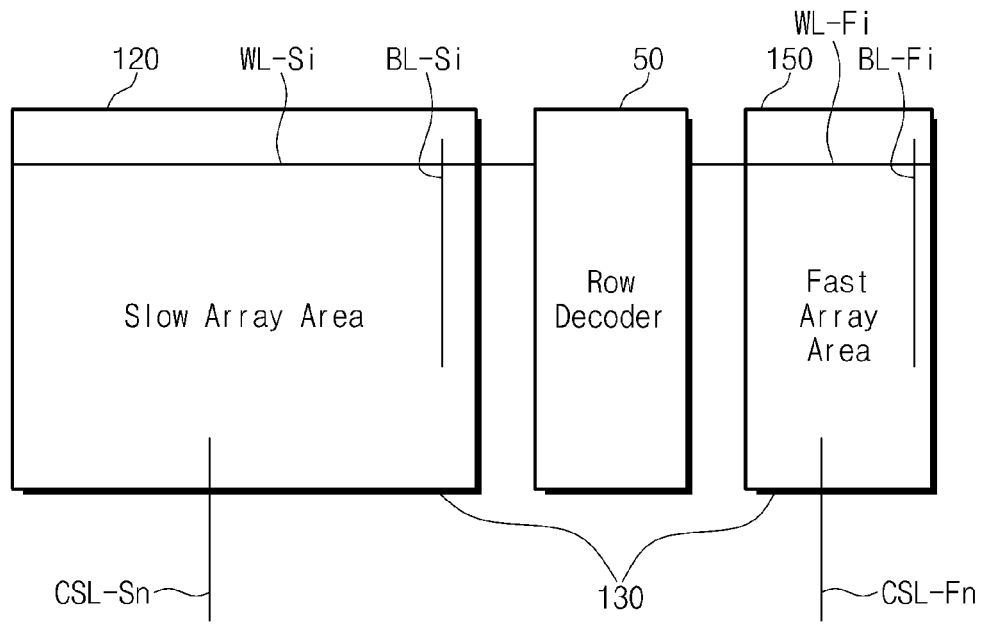
FIG. 12 is a diagram illustrating arrangement of word lines of a semiconductor memory cell array in FIG. 1 or 8 according to another exemplary embodiment.

FIG. 12 is a diagram illustrating an arrangement of word lines of a semiconductor memory cell array in FIG. 1 or 8 according to another exemplary embodiment.

Referring to FIG. 12, a semiconductor memory cell array 130 may include a slow array area 120 and a fast array area 150 which are spaced apart from each other with a row decoder interposed therebetween.

A word line WL-Si extended from the row decoder 50 may be disposed only at the slow array area 120, and a word line WL-Fi extended from the row decoder 50 may be disposed only at the fast array area 150. If the word line WL-Si is selected by the row decoder 50, memory cells of the slow array area 120 connected with the word line WL-Si may be accessed. Also, if the word line WL-Fi is selected by the row decoder 50, memory cells of the fast array area 150 connected with the word line WL-Fi may be accessed.

Since the number of memory cells of the fast array area 150 connected with the word line WL-Fi is less than the number of memory cells of the slow array area 120 connected with the word line WL-Si, word line loading of the fast array area 150 may be relatively small.

In the case that memory cells of the slow array area 120 and memory cells of the fast array area 150 are formed of homo cells, the cell-per-bit line number of the fast array area 150 may be less than a cell-per-bit line number of the slow array area 120. As such, the bit line loading of the fast array area 150 may be smaller than that of the slow array area 120. Thus, a read/write operating speed on the fast array area 150 may be faster than that on the slow array area 120.

A bit line BL-Fi of the fast array area 150 may be connected to a column selection line CSL-Fn via a bit line sense amplifier (not shown), and a bit line BL-Si of the slow array area 120 may be connected to a column selection line CSL-Sn via a bit line sense amplifier.

Although the column selection lines CSL-Fn and CSL-Sn may be simultaneously selected after the word lines WLi-Si and WL-Fi are simultaneously activated, write data received at a write operation may be stored at a memory cell of the fast array area 150 to be relatively faster. For example, a speed in which write data is stored at the slow array area 120 may be faster than a speed in which write data is stored at the fast array area 150.

Likewise, although the column selection lines CSL-Fn and CSL-Sn may be simultaneously selected after the word lines WLi-Si and WL-Fi are simultaneously activated, at a read operation, data stored at a memory cell of the fast array area 150 may be read out faster compared with data stored at a memory cell of the slow array area 120. As such, a speed in which data stored at the slow array area 120 is read out may be slower than a speed in which data stored at the fast array area 150 is read out.

In FIG. 12 where a word line of the slow array area 120 and a word line of the fast array area 150 are separated, in the case that bit line loading is different, a data access speed of the fast array area 150 may be faster than a data access speed of the slow array area 120.

In FIG. 12, since word line loading and bit line loading are differentiated, an access speed of the fast array area 150 may be faster than that in FIG. 11.

In example embodiments, the word lines WL-Si and WL-Fi may be activated at the same time using the same row address or at different points of time using different row addresses.

Figure 13:
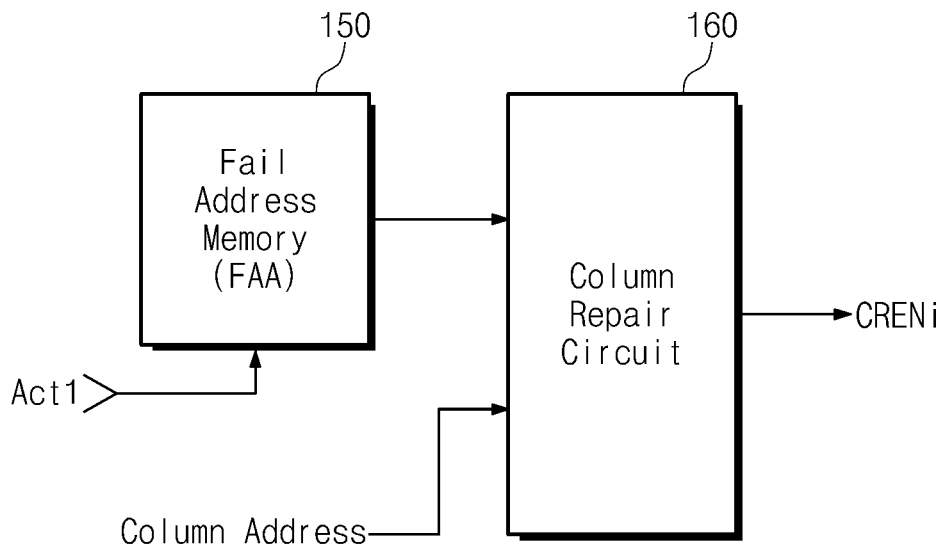
FIG. 13 is a diagram illustrating an embodiment in which a fast array area according to certain exemplary embodiments is applied to a column repair.

FIG. 13 is a diagram illustrating an exemplary embodiment in which a fast array area according to certain embodiments is applied to a column repair.

Referring to FIG. 13, a fast array area 150 may be used as a fail address memory for a column repair. A column repair circuit 160 of a semiconductor memory device may receive a fail address stored at the fail address memory 150 for a column repair operation. In general, a fail address may be obtained from a fuse circuit having fuses to be cut for a column repair. However, in case of FIG. 13, a fail address for a column repair operation may be loaded onto the fast array area 150 at power-up of the semiconductor memory device. As a result, a size of the semiconductor memory device may become compact by reducing or removing a fuse circuit.

An activation signal Act1 may include a word line enable signal and a column selection signal to access the fast array area 150.

At a column repair operation, the column repair circuit 160 for generating a column redundancy enable signal CRENi may compare a column address provided via an address buffer with a column fail address provided from the fail address memory 150. In the case that the column address coincides with the column fail address, a failed normal column of a slow array area 120 may be replaced with a redundancy column of the slow array area 120.

Since a data access speed of the fast array area 150 is relatively fast, the fast array area 150 may be used as a fail address memory which stores a column fail address for a column repair.

Figure 14:
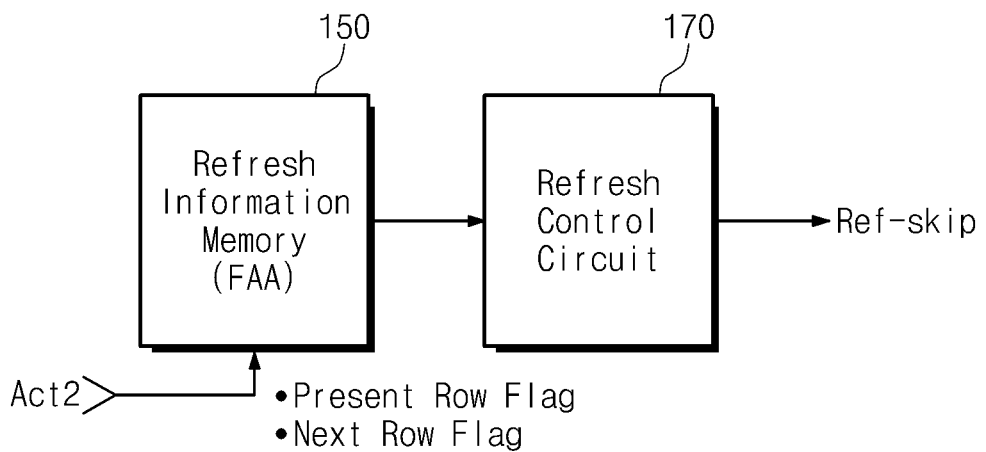
FIG. 14 is a diagram illustrating an embodiment in which a fast array area according to exemplary embodiments is used for refresh control.

FIG. 14 is a diagram illustrating an exemplary embodiment in which a fast array area according to certain embodiments is used for refresh control.

Referring to FIG. 14, a fast array area 150 may be used as a refresh information memory which stores refresh strong/weak information. A refresh control circuit 170 of a semiconductor memory device may receive refresh strong/weak data from the refresh information memory 150 to generate a refresh skip signal Ref-skip.

Herein, the refresh skip signal Ref-skip may be a disable signal for preventing activation of a word line to be refreshed when an auto refresh command is input or a self-refresh period arrives.

Likewise, an activation signal Act2 may include a word line enable signal and a column selection signal to access the fast array area 150.

At a refresh operation, the refresh control circuit 170 may receive refresh strong/weak data from the refresh information memory 150. In the case that a refresh strong signal is received, the refresh control circuit 170 may activate the refresh skip signal Ref-skip. In the case that a refresh weak signal is received, the refresh control circuit 170 may inactivate the refresh skip signal Ref-skip such that a word line to be refreshed is normally enabled.

Since a power of the semiconductor memory device is reduced by execution of the refresh skip operation, the operating performance of the semiconductor memory device may be improved.

Refresh strong/weak information may be stored at the refresh information memory 150 in a flag form. For example, data '1' may be stored as refresh strong information, and data '0' may be stored as refresh weak information.

In the case that memory cells of a semiconductor memory cell array are tested, a data storage ability of the tested memory cells can be determined to be relatively lowered. In this case, a row address indicating a specific word line may be stored at the refresh information memory 150 as refresh weak information.

In an array structure of FIG. 11, when a word line WLi is refreshed, refresh strong/weak information on a next row address may be provided from a memory cell connected with the word line WLi of the fast array area 150. Thus, the refresh control circuit 170 may determine whether to skip a refresh operation on a next word line WLi+1 according to the refresh strong/weak information.

In an array structure of FIG. 12, when a word line WLi-Si is refreshed, refresh strong/weak information on a current row address may be provided from a memory cell connected with a word line WLi-Fi of the fast array area 150. Thus, since an access to the fast array area 150 is relatively fast, the refresh control circuit 170 may determine whether to skip a refresh operation on the current word line WLi-Si according to the refresh strong/weak information.

Since a data access speed of the fast array area 150 is relatively fast, the fast array area 150 may be used as a refresh information memory which stores refresh strong/weak information for a refresh skip operation.

In FIG. 14, there is illustrated a refresh skip operation. However, it is possible to adjust a refresh period. For example, there may be applied a scheme in which relatively weak memory cells are frequently refreshed. In this case, the fast array area 150 may be used as a memory which stores refresh strong/weak information for a refresh period adjusting operation.

Figure 15:
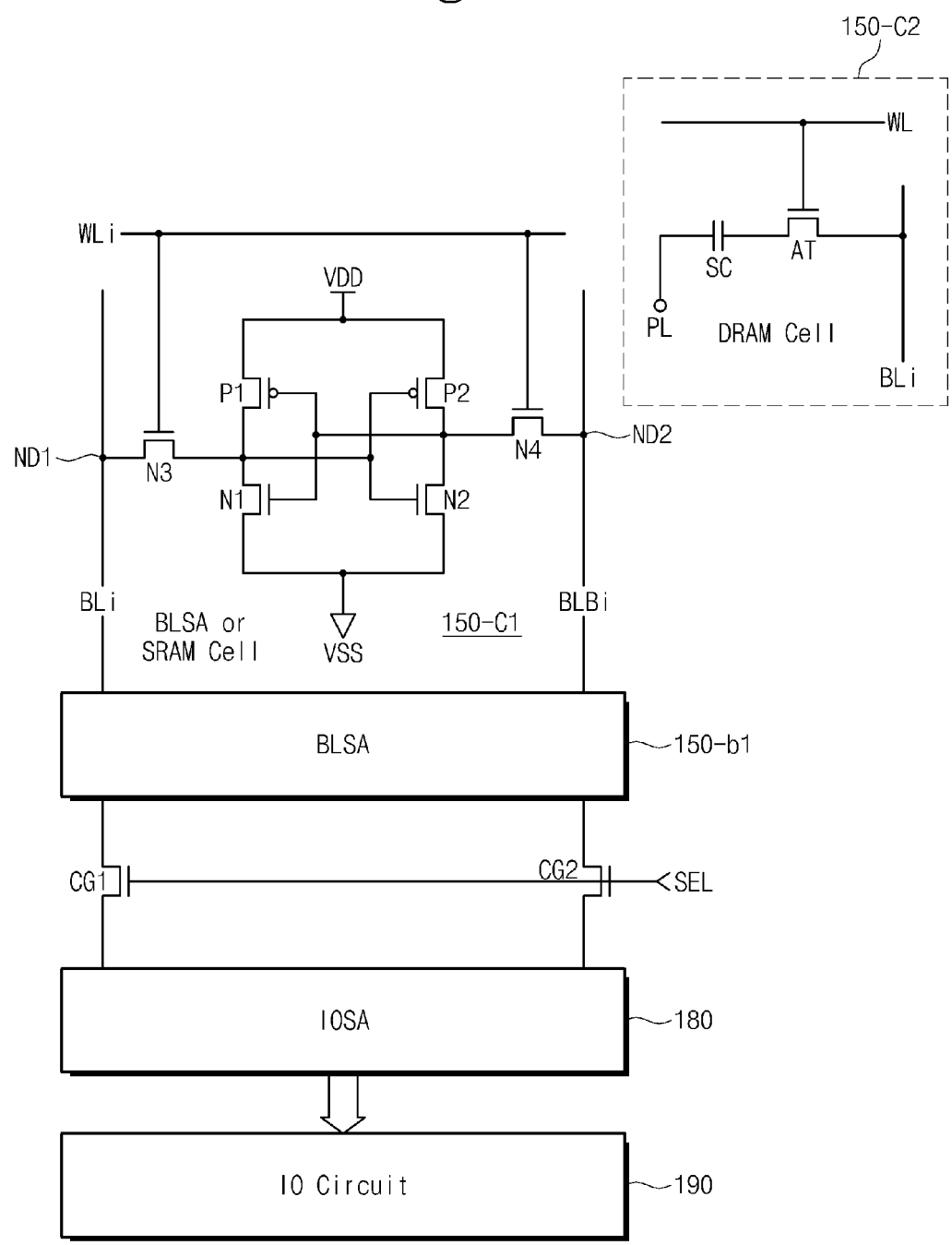
FIG. 15 is a diagram illustrating connection between a memory cell and an input-output sense amplifier applied to FIG. 1 or 8, according to exemplary embodiments.

FIG. 15 is a diagram illustrating connection between a memory cell and an input-output sense amplifier applied to FIG. 1 or 8, according to certain disclosed embodiments.

Referring to FIG. 15, the memory cells may be included in, for example, a fast array area 150 such as shown in FIG. 1 or 8. In FIG. 15, "150-C1" may indicate a CMOS SRAM cell formed of two PMOS transistors P1 and P2 and four NMOS transistors N1 to N4. In other embodiments, instead of the SRAM cell, a BLSA memory cell may be implemented by a bit line sense amplifier of a DRAM. In this case, two PMOS transistors P1 and P2 may be implemented by transistors of a p-type sense amplifier, two NMOS transistors N1 and N2 may be implemented by transistors of an n-type sense amplifier, and two NMOS transistors N3 and N4 may be implemented by transistors for driving a sense amplifier or by transistors fabricated for another purpose. In FIG. 15, a BLSA cell formed of an SRAM cell or a BLSA denoted by "150-C1" may indicate a hetero cell different from a cell formed at a slow array area 120.

As a homo cell, a DRAM cell having line (bit line/word line) loading smaller than that of a DRAM cell of the slow array area 120 may be used to form a fast array area 150. In FIG. 15, "150-C2" may indicate a DRAM cell having small line loading. A DRAM cell may be formed, for example, of an access transistor AT and a storage capacitor SC.

Loading of a bit line BLi connected with a drain of the access transistor AT may be smaller than that of a normal DRAM cell. For example, if 1024 memory cells are connected to a bit line of a normal DRAM cell, hundreds of memory cells may be connected to a bit line of a memory cell 150-C2.

A hetero cell or a homo cell may be connected to a bit line sense amplifier 150-b1. The bit line sense amplifier 150-b1 may be connected with an input-output sense amplifier 180 through selection gates CG1 and CG2 controlled by a selection line SEL such as a column selection line CSL. In FIG. 15, there is illustrated an example in which the bit line sense amplifier 150-b1 is connected to the input-output sense amplifier 180 directly through selection gates CG1 and CG2. However, in certain embodiments, a local sense amplifier can be interposed between the bit line sense amplifier 150-b1 and the input-output sense amplifier 180.

Thus, if a memory cell of the fast array area 150 is selected at a read mode of operation, data stored at a hetero cell or a homo cell may be read out rapidly through the bit line sense amplifier 150-b1, the input-output sense amplifier 180, and an input-output circuit 190 compared with data stored at a memory cell of the slow array area 120.

Figure 16:
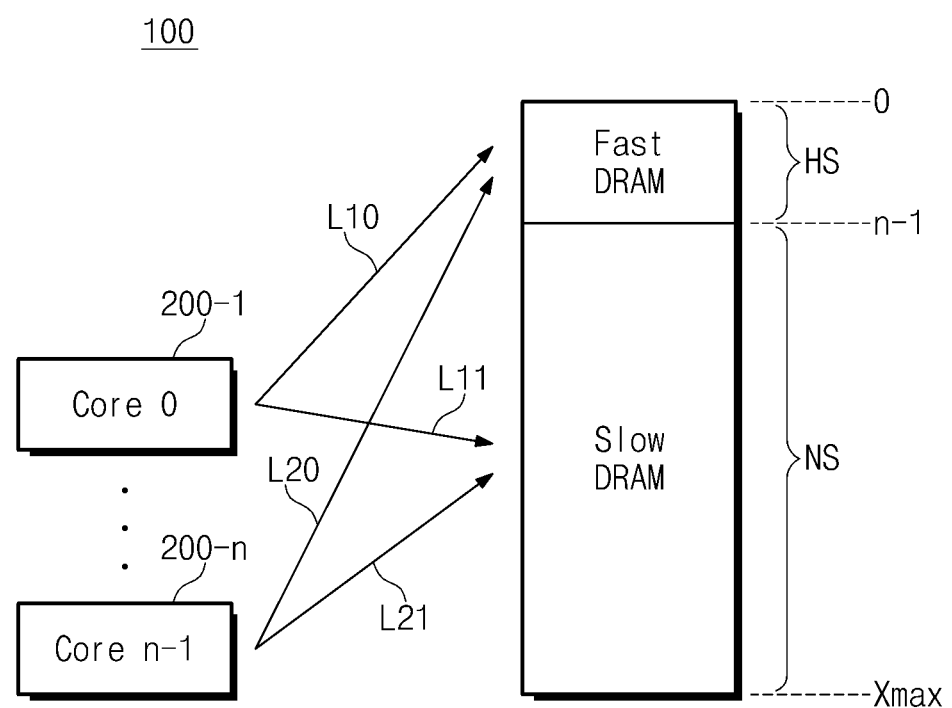
FIG. 16 is a diagram illustrating address mapping of a semiconductor memory cell array according to an exemplary embodiment.

FIG. 16 is a diagram illustrating address mapping of a semiconductor memory cell array according to an exemplary embodiment.

Referring to FIG. 16, a slow DRAM of a DRAM 100 or a first memory cell array area may be assigned to a normally accessed address NS, and a fast DRAM of the DRAM 100 or a second memory cell array area may be assigned to a highly accessed address HS. In this case, a plurality of cores 200-1 to 200-n each corresponding to a CPU may access the fast DRAM of the DRAM 100 or the second memory cell array area using the highly accessed address HS. Also, the plurality of cores 200-1 to 200-n may access the slow DRAM of the DRAM 100 or the first memory cell array area using the normally accessed address NS.

In the case that latency sensitive load exists, the core 200-1 may access the fast DRAM of the DRAM 100 or the second memory cell array area using the highly accessed address HS. This may be depicted by a line L10.

In the case that bandwidth sensitive load exists, the core 200-1 may access the slow DRAM of the DRAM 100 or the first memory cell array area using the normally accessed address NS. This may be depicted by a line L11.

As described above, in the case that a slow DRAM and a fast DRAM are separately accessed using two parts partitioned from one address, an AC parameter of a memory may be improved. Thus, the operating performance may be improved.

Figure 17:
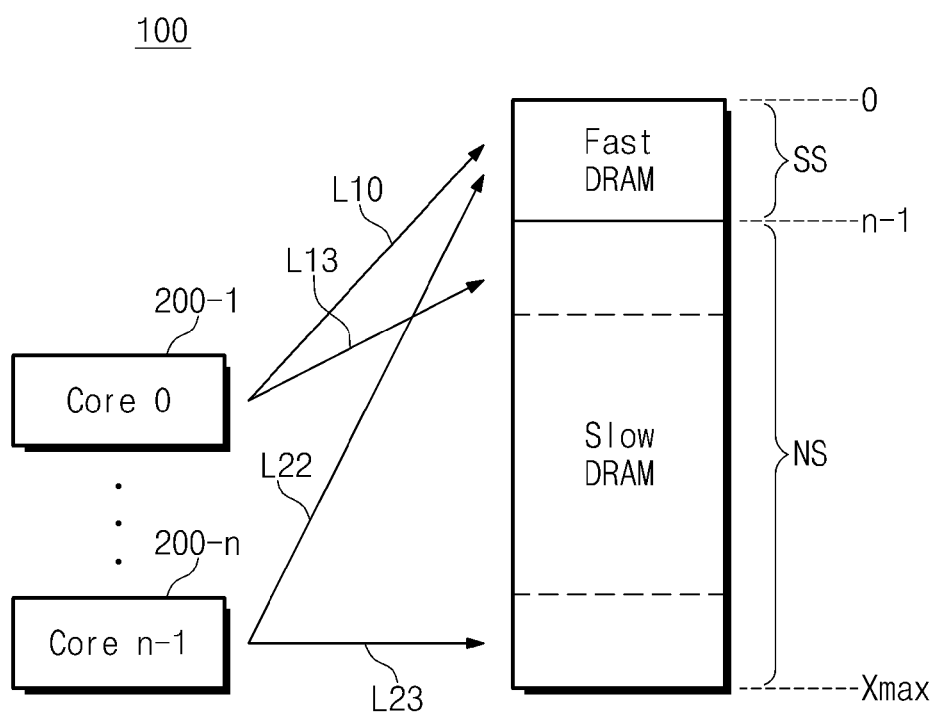
FIG. 17 is a diagram illustrating address mapping of a semiconductor memory cell array according to another exemplary embodiment.

FIG. 17 is a diagram illustrating address mapping of a semiconductor memory cell array according to another exemplary embodiment.

In FIG. 17, there is illustrated an example in which in a multi-core system a shared address space is applied to a fast DRAM or a second memory cell array area.

A slow DRAM of a DRAM 100 or a first memory cell array area may be assigned to an isolated address space NS, and a fast DRAM of the DRAM 100 or a second memory cell array area may be assigned to a shared address space SS.

A plurality of cores 200-1 to 200-n each corresponding to a CPU may access the fast DRAM of the DRAM 100 or the second memory cell array area as the shared address space SS. Also, the plurality of cores 200-1 to 200-n may access the slow DRAM of the DRAM 100 or the first memory cell array area as the isolated address space NS In the case that a tWR management is critical, the core 200-1 may access the shared address space SS, at which the fast DRAM of the DRAM 100 or the second memory cell array area is placed, along a line L10. The core 200-1 may access the isolated address space NS, at which the slow DRAM of the DRAM 100 or the first memory cell array area is placed, using a locally assigned address. This may be depicted by a line L13. Meanwhile, the core 200-n may access the isolated address space NS, at which the slow DRAM of the DRAM 100 or the first memory cell array area is placed, using a locally assigned address. This may be depicted by a line L23. As a result, an internal memory region of the slow DRAM or the first memory cell array accessed by each core may be different.

Figure 18A:
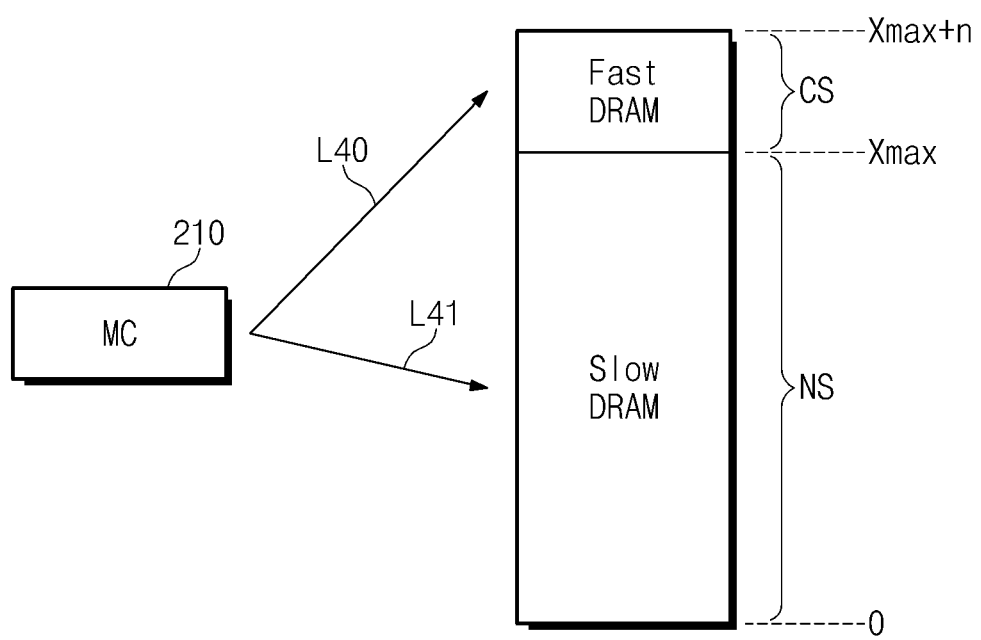
FIGS. 18A to 18C are diagrams illustrating address mapping of a semiconductor memory cell array according to other exemplary embodiments.
Figure 18B:
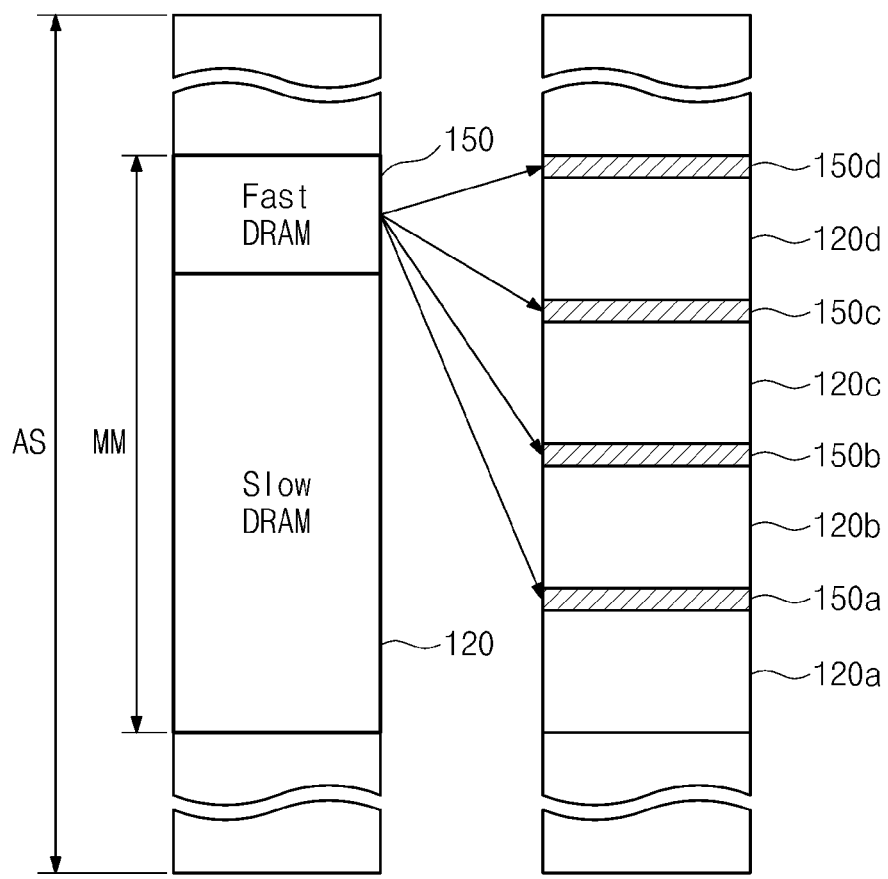
Figure 18C:
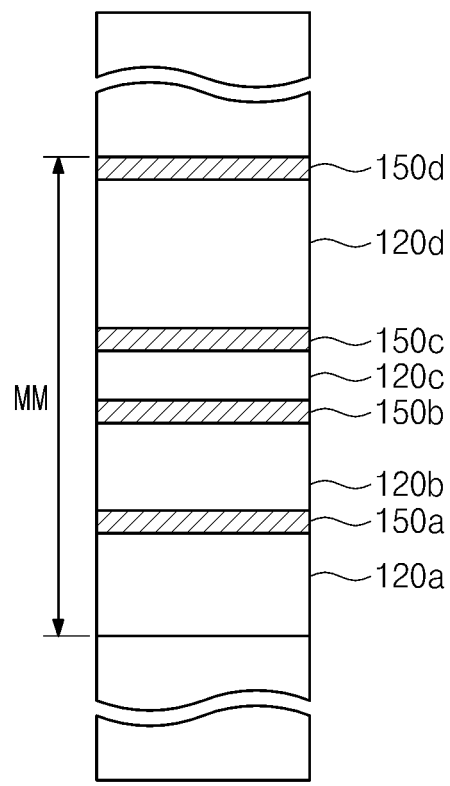

FIGS. 18A to 18C are diagrams illustrating address mapping of a semiconductor memory cell array according to other exemplary embodiments.

Referring to FIG. 18A, a memory controller 210 controlling a DRAM 100, also referred to as a DRAM controller, may access a fast DRAM or a second memory cell array area of the DRAM 100 along a line L40. The memory controller 210 may access a slow DRAM or a first memory cell array area of the DRAM 100 along a line L41.

In FIG. 18A, the slow DRAM or the first memory cell array area may be used as a normal DRAM by the memory controller 210. As a result, the slow DRAM or the first memory cell array area may be assigned to a normal address space.

On the other hand, the fast DRAM or the second memory cell array area may be used as a buffer memory by the memory controller 210. As a result, the fast DRAM or the second memory cell array area may be assigned to a cache space.

The cache space may act as temporary storage to reduce address conflict. For example, in the case that read delay is anticipated due to slow tWR, the memory controller 210 may copy data in the slow DRAM to the fast DRAM, and may write the copied data back later. Meanwhile, in the case that a self-refresh address and a read/write address are conflicted, the copy operation may be performed.

As described above, in FIG. 18, there is illustrated an example in which the fast DRAM or a fast array area is used as a buffer zone for the memory controller 210.

Referring to FIG. 18B, a fast DRAM 150 may be disposed within an n-bit address space AS to be continuous or discontinuous at a main memory (MM) address space. For example, in case of discontinuous arrangement, the fast DRAM 150 may be provided among partitioned slow DRAM areas 120a to 120d as fast DRAM sub-areas 150a to 150d. As illustrated in FIG. 18B, the fast DRAM sub-area 150a may be disposed between slow DRAM sub-areas 120a and 120b in an alternating manner. With the above description, the fast DRAM sub-areas 150a to 150d may have discontinuous addresses.

Referring to FIG. 18C, there are illustrated fast DRAM sub-areas 150a to 150d having discontinuous addresses, and intervals among the discontinuous addresses may be irregular. Unlike FIG. 18B, address intervals in FIG. 18C may be irregular. As described above, the fast DRAM area may have a continuous address distribution or a discontinuous address distribution among slow DRAM areas. Also, in case of a discontinuous address distribution, the fast DRAM area may be disposed such that address intervals are either regular or irregular (e.g., intervals being the same distance apart from each other, or interval separated from each other by different distances).

Figure 19:
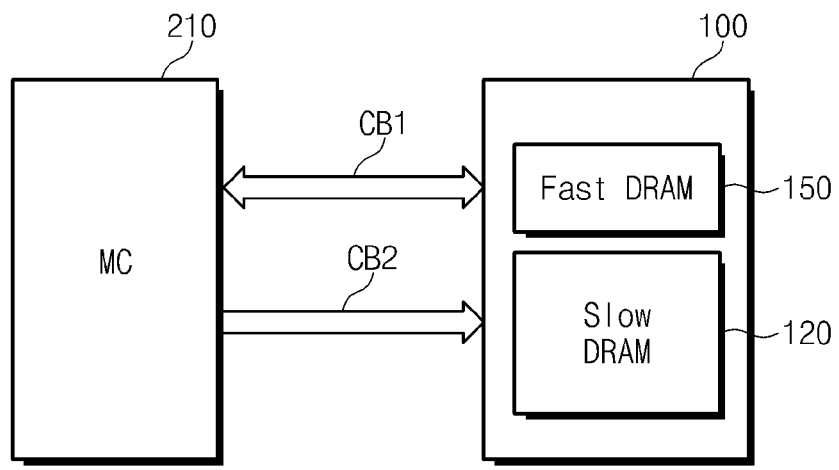
FIG. 19 is a diagram illustrating an interface of a semiconductor memory according to an exemplary embodiment.

FIG. 19 is a diagram illustrating an interface of a semiconductor memory according to an exemplary embodiment.

Referring to FIG. 19, a memory controller 210 and a DRAM 100 may be interconnected via common buses CB1 and CB2. The common bus CB1 may be a data bus which is used in common by a fast DRAM 150 and a slow DRAM 120.

The common bus CB2 may be a command or address bus which is used to transfer a command or an address to the fast DRAM 150 or the slow DRAM 120 in common.

As a result, a typical interface between the memory controller 210 and the DRAM 100 may be used, and the memory controller 210 and the DRAM 100 may be interfaced in a time division manner.

Figure 20:
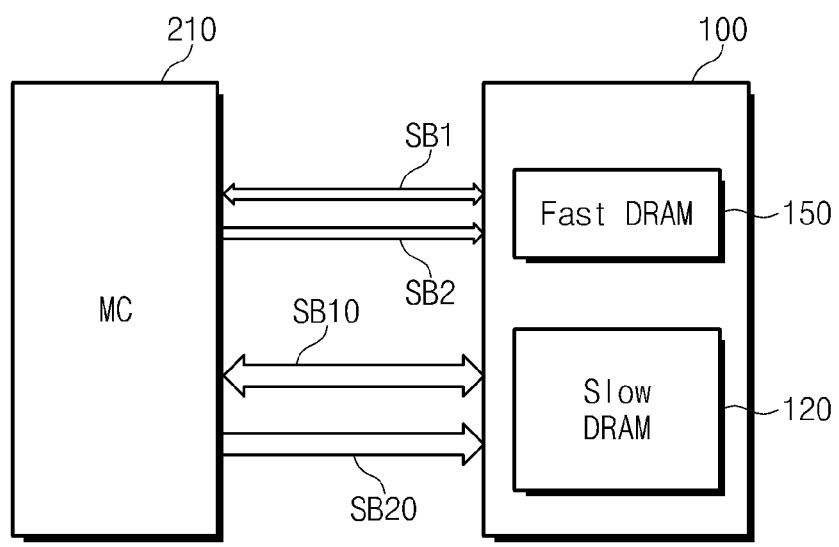
FIG. 20 is a diagram illustrating an interface of a semiconductor memory according to another exemplary embodiment.

FIG. 20 is a diagram illustrating an interface of a semiconductor memory according to another exemplary embodiment.

Referring to FIG. 20, a memory controller 210 and a DRAM 100 may be interconnected via dedicated buses SB1, SB2, SB10, and SB20. The dedicated bus SB1 may be a data bus only used by a fast DRAM 150. The dedicated bus SB2 may be a command or address bus which is used to transfer a command or an address only to the fast DRAM 150.

The dedicated bus SB10 may be a data bus only used by a slow DRAM 120. The dedicated bus SB20 may be a command or address bus which is used to transfer a command or an address only to the slow DRAM 120.

As a result, an interface may be implemented separately between the memory controller 210 and the fast DRAM 150. In FIG. 20, an interface may be added or the operating performance may be implemented maximally.

Figure 21:
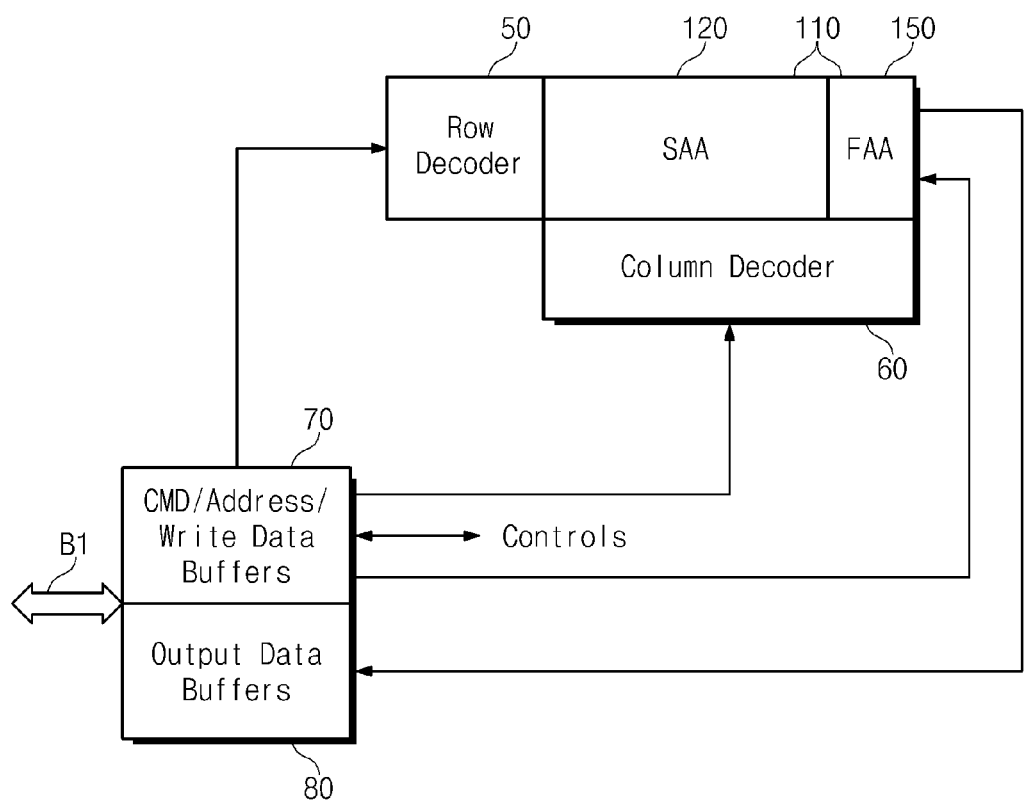
FIG. 21 is a block diagram schematically illustrating an application of various embodiments applied to a semiconductor memory device.

FIG. 21 is a block diagram schematically illustrating an application of the disclosed embodiments applied to a semiconductor memory device, according to certain exemplary embodiments.

Referring to FIG. 21, a semiconductor memory device may include a memory cell array 110, a row decoder 50, a column decoder 60, command/address write data buffers 70, and output data buffers 80.

The memory cell array 110 may include a slow array area 120 and a fast array area 150. Memory cells of the fast array area 150 may be formed of at least one of a DRAM memory cell having small line loading, an SRAM memory cell, and a memory cell using a bit line sense amplifier.

The command/address write data buffers 70 may receive and buffer a command, an address, and write data.

The row decoder 50 may decode a row address to select a row of the memory cell array 110. The column decoder 60 may decode a column address to select a column of the memory cell array 110.

The output data buffers 80 may buffer data output from the memory cell array 110. At a read mode of operation, the output data buffers 80 may output the output data to an I/O bus B1.

Frequently accessed data may be stored at the fast array area 150 of the memory cell array 110. At a read operation, specific row and column of the fast array area 150 may be selected by the decoders 50 and 60. At this time, data output from a memory cell of the fast array area 150 may be read by IOSA of a device in relatively high speed, and the read data may be provided to the output data buffers 80. Thus, the data output performance may be improved.

Meanwhile, normal data may be stored at the slow array area 120 of the memory cell array 110. At a read operation, a specific row and column of the fast array area 150 may be selected by the decoders 50 and 60. At this time, data output from a memory cell of the slow array area 120 may be read by IOSA of a device in relatively slow speed, and the read data may be provided to the output data buffers 80. Thus, it is possible to obtain a low-power consumption operating characteristic by utilizing the slow array area 120.

Figure 22:
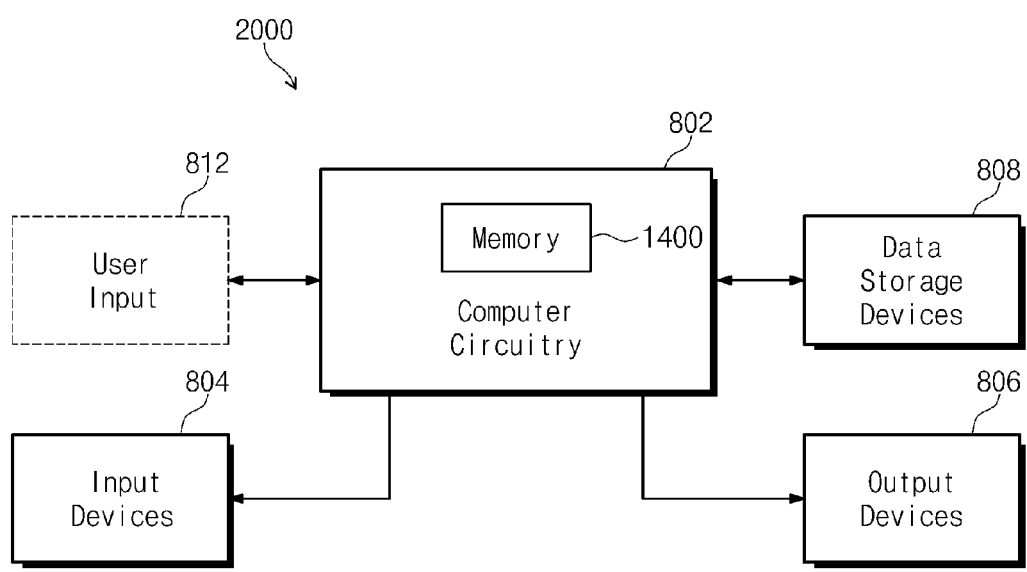
FIG. 22 is a block diagram schematically illustrating an application of various embodiments applied to a data processing device.

FIG. 22 is a block diagram schematically illustrating an application of the disclosed embodiments applied to a data processing device.

Referring to FIG. 22, a data processing device 2000 may include a computer circuit 802 including a memory 1400, input devices 804, output devices 806, and data storage devices 808. Also, for convenience of a user, the data processing device 2000 may further include a user input unit 812. The user input unit 812 may be formed of input devices such as number keys, function keys, etc. and may provide an interface between the data processing device 2000 and a person.

As illustrated in FIG. 1 or 8, the memory 1400 may be a memory in which a fast array area 150 is implemented within a chip where a slow array area is disposed. The fast array area 150 may be used as a cache memory. In this case, a data processing speed of the data processing device 2000 may be improved. As such, the operating performance may be improved.

Figure 23:
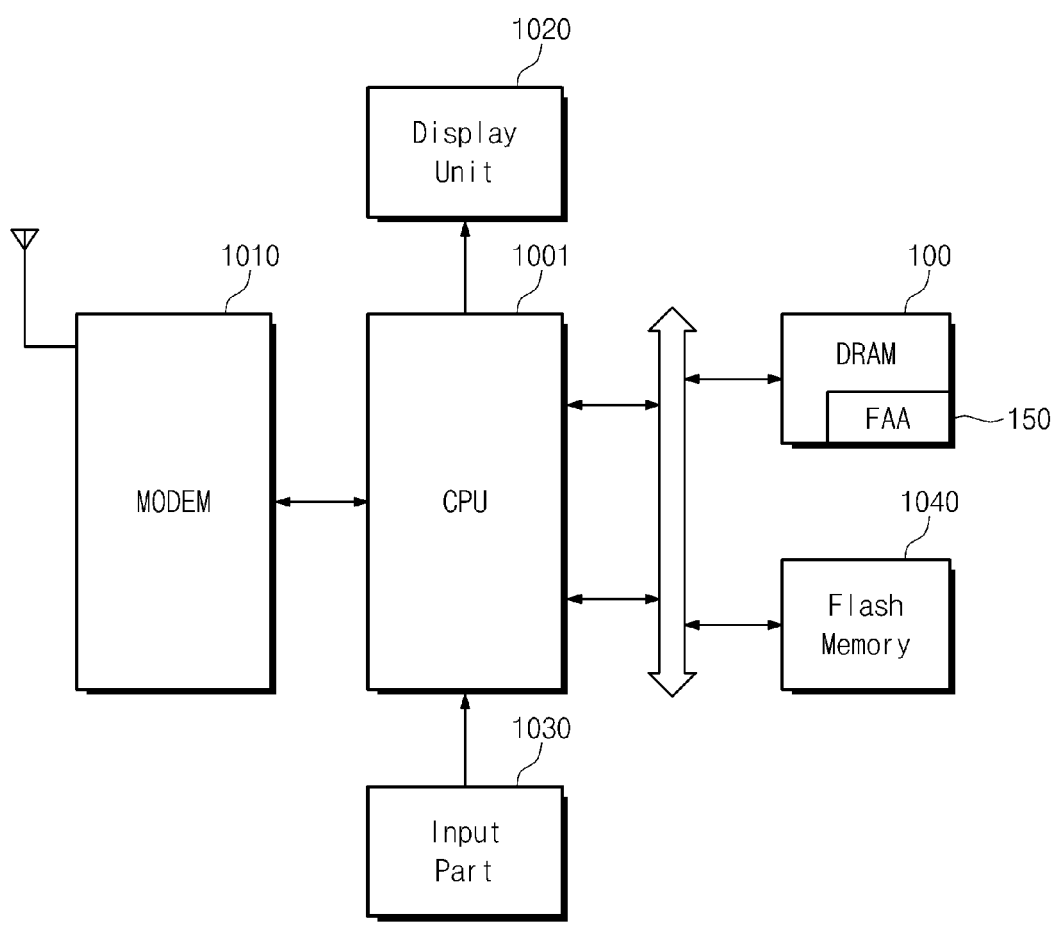
FIG. 23 is a block diagram an application of various embodiments applied to a mobile device.

FIG. 23 is a block diagram an application of the disclosed embodiments applied to a mobile device.

Referring to FIG. 23, a mobile device may include a modem 1010, a CPU 1001, a DRAM 100, a flash memory 1040, a display unit 1020, and an input unit 1030.

As illustrated in FIG. 1 or 8, the DRAM 100 may include a fast array area 150 implemented within a chip where a slow array area is disposed.

If necessary, the CPU 1001, the DRAM 100, and the flash memory 1040 may be fabricated in a single chip or may be included in a package.

The modem 1010 may be configured to modulate and demodulate communication data.

The CPU 1001 may control an overall operation of the mobile device according to a predetermined program.

The DRAM 100 may be used as a main memory of the CPU 1001, and may be a synchronous DRAM.

The flash memory 1040 may be, for example, a NOR or NAND flash memory.

The display unit 1020 may include, for example, a liquid crystal having a backlight or an LED light source or a touch screen as an element such as OLED. The display unit 1020 may be used as an output element which displays color images such as characters, numbers, pictures, and so on.

The input unit 1030 may be formed of input devices such as number keys, a function keys, etc. and provide an interface between the mobile device and a person.

Since the DRAM 100 adopts a cell array structure illustrated in FIG. 1 or 8, the operating performance may become more powerful. At a data processing operation not necessitating a speed, low-power consumption may be accomplished through a slow array area.

The mobile device may be used as a mobile communication device, or may be used as a smart card or a solid state drive (SSD) by adding or reducing constituent elements as occasion demands.

The mobile device may be connected with an external communication device via a separate interface. The communication device may be, for example, a DVD player, a computer, a set top box (STB), a game machine, a digital camcorder, or the like.

Although not shown in FIG. 23, the mobile device may further include an application chipset, a camera image processor (CIS), a mobile DRAM, and so on.

A chip forming the mobile device may be packed by a variety of packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and so on.

In FIG. 23, there is illustrated an example in which a flash memory is adopted. However, other nonvolatile memory such as a nonvolatile storage can be used.

The nonvolatile storage may store a variety of data information such as texts, graphics, software codes, and so one.

The nonvolatile storage may be, for example, an Electrically Erasable Programmable Read-Only Memory (EEPROM), a flash memory, a Magnetic RAM (MRAM), a Spin-Transfer Torque MRAM (STT-MRAM), a Conductive bridging RAM (CBRAM), a Ferroelectric RAM (FeRAM), a Phase change RAM (PRAM) called an Ovonic Unified Memory (OUM), a Resistive RAM (RRAM or ReRAM), a Nanotube RRAM, a Polymer RAM (PoRAM), a Nano Floating Gate Memory (NFGM), a holographic memory, a molecular electronics memory, or an insulator resistance change memory.

In certain examples shown above, an entire memory array on a chip may be divided into a slow array area and a fast array area, wherein the slow array area and fast array area comprise the entire memory array. In certain embodiments, as described above, each memory cell in the fast array area has a set of characteristics (e.g. type, associated line loading, access speed, etc.), and each memory cell in the slow array area has a set of characteristics that include at least one different characteristic from any of the cells in the fast array area. For example, in an embodiment such as described in connection with FIG. 2, each memory cell in the slow array area may have a first type (DRAM cells) and each memory cell in the fast array area may have a second type (BLSA cells). Similarly, in an embodiment such as described in connection with FIG. 3, each memory cell in the slow array area may have a first line loading, and each memory cell in the fast array area has a second line loading smaller than the first line loading.

While the above disclosure has been described with reference to exemplary embodiments, it will be apparent to those skilled in the art that various changes and modifications may be made without departing from the spirit and scope of the exemplary embodiments. Therefore, it should be understood that the above embodiments are not limiting, but illustrative.

For example, a detailed circuit of a fast array area, a cell configuration, or an interface manner may be variously modified or changed without departing from the spirit and scope of the present disclosure. Also, a memory cell of a fast array area may be formed of a volatile memory cell. However, the inventive concept is not limited thereto. For example, a memory cell of a fast array area may be formed of a nonvolatile memory cell. And, the fast array area may be divided into three or more regions so as to be used for a variety of purposes.

What is claimed is:

1. A semiconductor memory cell array, comprising:
a first memory cell array area including a first group of memory cells arranged in a chip in a matrix of rows and columns and having a first operating speed; and
a second memory cell array area including a second group of memory cells arranged in the chip in a matrix of rows and columns and having a second operating speed faster than the first operating speed,
wherein the semiconductor memory cell array is configured such that the first and second memory cell array areas are accessed by addressing of a dynamic random access memory (DRAM) controller, and
wherein the second memory cell array area is positioned between an input-output sense amplifier and the first memory cell array area, such that the second memory cell array area is disposed to be closer to the input-output sense amplifier than the first memory cell array area is to the input-output sense amplifier.

2. The semiconductor memory cell array of claim 1, wherein the first group of memory cells and the second group of memory cells are different types of cells.

3. The semiconductor memory cell array of claim 2, wherein the first group of memory cells are formed of DRAM cells, and the second group of memory cells are formed using a bit line sense amplifier.

4. The semiconductor memory cell array of claim 2, wherein the first group of memory cells are formed of DRAM cells, and the second group of memory cells are static random access memory (SRAM) cells.

5. The semiconductor memory cell array of claim 1, wherein the first group of memory cells and the second group of memory cells are same types of cells.

6. The semiconductor memory cell array of claim 5, wherein the first group of memory cells are DRAM cells having normal word line loading, and the second group of memory cells are DRAM cells having loading smaller than the normal word line loading.

7. The semiconductor memory cell array of claim 5, wherein the first group of memory cells are DRAM cells having normal bit line loading, and the second group of memory cells are DRAM cells having loading smaller than the normal bit line loading.

8. The semiconductor memory cell array of claim 5, wherein the first group of memory cells are SRAM cells having normal word line loading, and the second of group memory cells are SRAM cells having loading smaller than the normal word line loading.

9. The semiconductor memory cell array of claim 5, wherein the first group of memory cells are SRAM cells having normal bit line loading, and the second group of memory cells are SRAM cells having loading smaller than the normal bit line loading.

10. A semiconductor memory cell array, comprising:
a first memory cell array area including a first group of memory cells arranged in a chip in a matrix of rows and columns and having a first operating speed, the first memory cell array area including slow memory cell arrays alternately arranged between a plurality of bit line sense amplifiers; and
a second memory cell array area including a second group of memory cells arranged in the chip in a matrix of rows and columns and having a second operating speed faster than the first operating speed, an input-output sense amplifier being interposed between the first memory cell array area and the second memory cell array area.

11. The semiconductor memory cell array of claim 10, wherein a normally accessed address is assigned to the first memory cell array area and a highly accessed address is assigned to the second memory cell array area.

12. The semiconductor memory cell array of claim 10, wherein the first memory cell array area is assigned to a bandwidth sensitive load and the second memory cell array area is assigned to a latency sensitive load.

13. The semiconductor memory cell array of claim 10, wherein the first memory cell array area is assigned to an isolated address space and the second memory cell array area is assigned to a shared address space.

14. The semiconductor memory cell array of claim 10, wherein the first memory cell array area is configured to be accessed using an extended address and the second memory cell array area is configured to be accessed using a basic address.

15. The semiconductor memory cell array of claim 10, wherein the first memory cell array area is configured to be accessed using a high address of a basic address and the second memory cell array area is configured to be accessed using a low address of the basic address.

16. The semiconductor memory cell array of claim 10, wherein the second memory cell array area is disposed to be separated into a plurality of regions according to an access speed.

17. The semiconductor memory cell array of claim 10, wherein the second memory cell array area is connected with a memory controller via a dedicated data bus and a dedicated command bus.

18. A semiconductor memory cell array, comprising:
a first memory cell array area including a first group of memory cells arranged in a chip in a matrix of rows and columns and having a first operating speed; and
a second memory cell array area including a second group of memory cells arranged in the chip in a matrix of rows and columns and having a second operating speed faster than the first operating speed,
wherein the semiconductor memory cell array is configured such that the first memory cell array area and the second memory cell array area are accessed by addressing of a DRAM controller and have different bit line loading from each other, and
wherein the second memory cell array area is connected with a column repair circuit and is configured to be used as a fail address memory to store fail column addresses for a column repair.

19. The semiconductor memory cell array of claim 18, wherein the first memory cell array area and the second memory cell array area share a word line enable signal of a row decoder to have the same word line loading.

20. The semiconductor memory cell array of claim 18, wherein the first memory cell array area and the second memory cell array area are connected to separated word lines and have different word line loading.

21. The semiconductor memory cell array of claim 18, wherein the second memory cell array area is connected with a refresh control circuit and is configured to be used as a refresh information memory to store refresh strong/weak data for a refresh skip operation.

22. The semiconductor memory cell array of claim 21, wherein the refresh strong/weak data is stored in a flag form and is refresh information on a current or next row address.

23. The semiconductor memory cell array of claim 18, wherein an address distribution of the second memory cell array area has a continuous address distribution.

24. The semiconductor memory cell array of claim 18, wherein an address distribution of the second memory cell array area is placed between address distributions of the first memory cell array area and has a discontinuous address distribution.

25. The semiconductor memory cell array of claim 24, wherein address intervals of the second memory cell array area are regular or irregular.

26. A semiconductor memory cell array, comprising:
a first memory cell array including a first group of memory cells arranged in a chip in a matrix of rows and columns and having a first operating speed; and
a second memory cell array including a second group of memory cells arranged in the chip in a matrix of rows and columns and having a second operating speed faster than the first operating speed,
wherein:
a distance between the second memory cell array and an input/output sense amplifier is less than the than a distance between the first memory cell array and the input/output sense amplifier; and the second memory cell array is positioned between the input-output sense amplifier and the first memory cell array.

27. The memory cell array of claim 26, wherein the first memory cell array includes DRAM memory cells, and the second memory cell array includes SRAM or bit line sense amplifier memory cells.

28. The memory cell array of claim 27, wherein the memory cells of the second memory cell array have smaller word line loading than the memory cells of the first memory cell array.

29. The memory cell array of claim 28, wherein the memory cells of the second memory cell array are connected to word lines that are shorter than word lines connected to the memory cells of the first memory array.

* * * * *